(12) United States Patent
Kish et al.

(10) Patent No.: US 12,016,136 B2
(45) Date of Patent: Jun. 18, 2024

(54) IRRIGATION CONTROLLER HAVING A ROTATABLE AND NON-DETACHABLE USER INTERFACE MODULE

(71) Applicant: The Toro Company, Bloomington, MN (US)

(72) Inventors: Steve Kish, Bloomington, MN (US); Matt Hall, Bloomington, MN (US); Chris Asmus, Bloomington, MN (US); Rengan Rajendran, Bloomington, MN (US); Saroj Manandhar, Bloomington, MN (US)

(73) Assignee: The Toro Company, Bloomington, MN (US)

(*) Notice: Subject to any disclaimer, the term of this patent is extended or adjusted under 35 U.S.C. 154(b) by 259 days.

(21) Appl. No.: 17/335,844

(22) Filed: Jun. 1, 2021

(65) Prior Publication Data

US 2021/0378110 A1  Dec. 2, 2021

Related U.S. Application Data

(60) Provisional application No. 63/032,997, filed on Jun. 1, 2020.

(51) Int. Cl.
  *H05K 5/00* (2006.01)
  *H05K 5/02* (2006.01)
  *H02G 3/08* (2006.01)
  *H02G 3/14* (2006.01)

(52) U.S. Cl.
  CPC ......... *H05K 5/0017* (2013.01); *H05K 5/0204* (2013.01); *H05K 5/0226* (2013.01); *H02G 3/088* (2013.01); *H02G 3/14* (2013.01)

(58) Field of Classification Search
  CPC .... A01G 25/16; H05K 5/0226; H05K 5/0204; H05K 5/0017; H02G 3/088; H02G 3/14
  See application file for complete search history.

(56) References Cited

U.S. PATENT DOCUMENTS

| | | | | |
|---|---|---|---|---|
| 7,257,465 | B2 * | 8/2007 | Perez | A01G 25/16 239/69 |
| 7,457,687 | B1 * | 11/2008 | Porter | A01G 25/165 239/69 |
| 7,613,546 | B2 * | 11/2009 | Nelson | A01G 25/165 239/69 |
| 7,640,079 | B2 * | 12/2009 | Nickerson | A01G 25/16 239/69 |
| 7,844,367 | B2 * | 11/2010 | Nickerson | G05D 7/0617 239/69 |
| 8,498,099 | B1 * | 7/2013 | Schmuckle | H05K 5/0226 361/679.01 |
| 9,144,204 | B2 * | 9/2015 | Redmond | A01G 25/167 |
| 9,345,155 | B1 * | 5/2016 | Schmuckle | H05K 5/0017 |
| 9,577,415 | B1 * | 2/2017 | Veloskey | H05K 5/0026 |
| 10,285,344 | B2 * | 5/2019 | Stange | G05B 15/02 |
| 10,444,769 | B2 * | 10/2019 | Weiler | G05B 19/042 |

(Continued)

*Primary Examiner* — Rockshana D Chowdhury
*Assistant Examiner* — Douglas R Burtner
(74) *Attorney, Agent, or Firm* — Inskeep IP Group, Inc.

(57) ABSTRACT

Described herein is an irrigation controller having a rotating user interface where the front side of the user interface can be rotated 180 degrees so that it faces the inside of the controller housing. This functionality allows the user to install or modify the irrigation wiring while also programming the irrigation settings and/or schedule.

19 Claims, 22 Drawing Sheets

(56) References Cited

U.S. PATENT DOCUMENTS

| | | | | |
|---|---|---|---|---|
| 10,757,873 | B2* | 9/2020 | Weiler | G05B 19/042 |
| 2005/0038529 | A1* | 2/2005 | Perez | A01G 25/16 |
| | | | | 700/20 |
| 2005/0267641 | A1* | 12/2005 | Nickerson | G05B 15/02 |
| | | | | 700/284 |
| 2005/0273205 | A1* | 12/2005 | Nickerson | A01G 25/16 |
| | | | | 700/284 |
| 2008/0027587 | A1* | 1/2008 | Nickerson | G05D 7/0676 |
| | | | | 700/284 |
| 2008/0058964 | A1* | 3/2008 | Nickerson | G05B 19/0426 |
| | | | | 700/19 |
| 2012/0215366 | A1* | 8/2012 | Redmond | A01G 25/167 |
| | | | | 700/284 |
| 2012/0274219 | A1* | 11/2012 | Woytowitz | H05B 47/28 |
| | | | | 361/679.01 |
| 2014/0018965 | A1* | 1/2014 | Pearson | G05B 15/02 |
| | | | | 700/284 |
| 2016/0286169 | A1* | 9/2016 | Sannala | G08B 13/19619 |
| 2017/0328997 | A1* | 11/2017 | Silverstein | G01S 7/41 |
| 2018/0077880 | A1* | 3/2018 | Stange | G05B 15/02 |
| 2018/0307253 | A1* | 10/2018 | Weiler | G05D 7/0617 |

\* cited by examiner

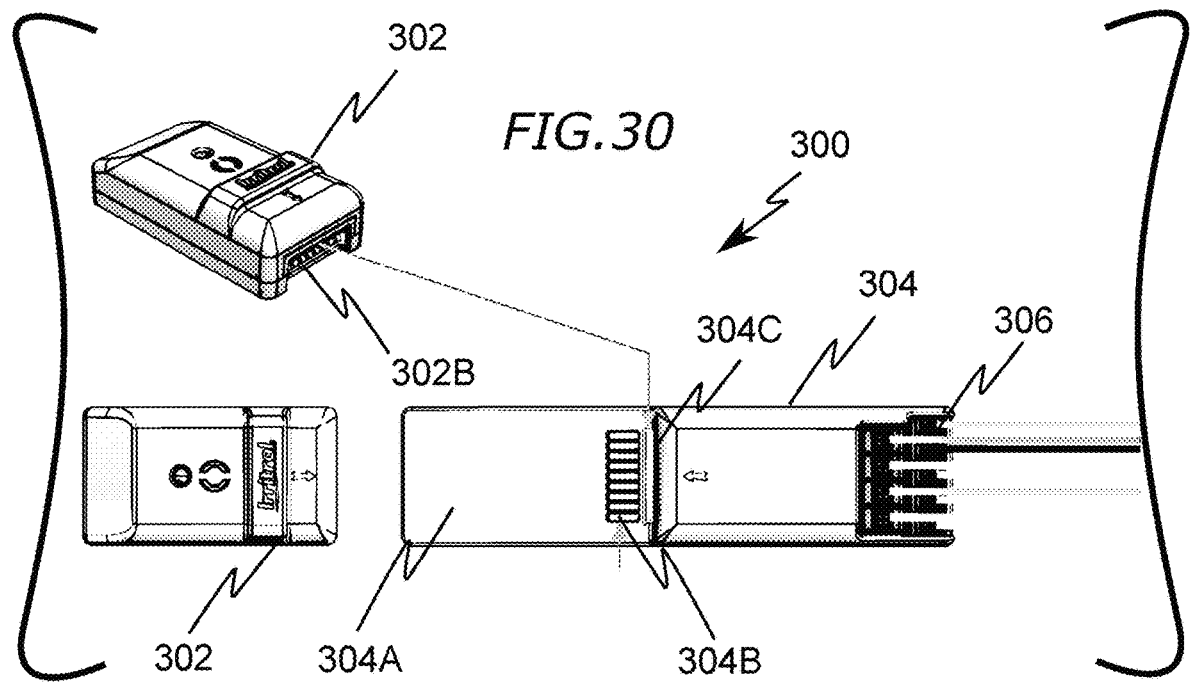
FIG.30
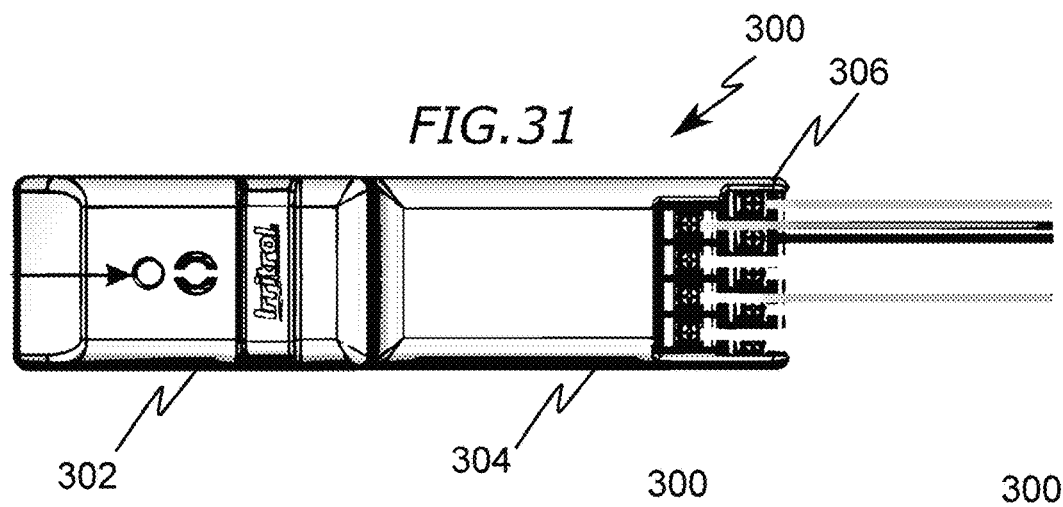
FIG.31
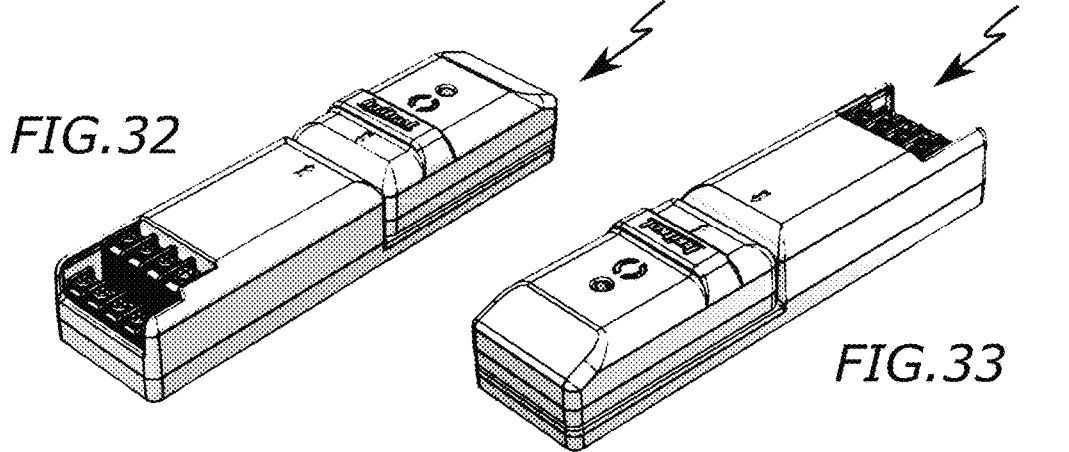
FIG.32
FIG.33

IRRIGATION CONTROLLER HAVING A ROTATABLE AND NON-DETACHABLE USER INTERFACE MODULE

RELATED APPLICATIONS

This application claims benefit of and priority to U.S. Provisional Application Ser. No. 63/032,997 filed Jun. 1, 2020 entitled Sprinkler Controller With Rotating Display, which is hereby incorporated herein by reference in its entirety.

BACKGROUND OF THE INVENTION

Irrigation systems are commonly used to compensate for inadequate rainfall by artificially watering turf or other landscape. In their most basic form, irrigation systems comprise water supply lines that direct water to a group of sprinklers. Each sprinkler is placed at varying positions around the landscape, preferably maximizing the area on which water is disbursed.

Control of each sprinkler is typically left to valves coupled to the water supply lines, preventing or allowing water to flow to each of the sprinkler heads. In some residential and commercial irrigation systems, electrically controlled solenoid valves are operatively connected to an irrigation controller or central computer. These irrigation controllers include a microprocessor with an input interface (such as a dial and buttons) where a user can program a desired watering schedule. When the watering schedule calls for irrigation of at least a portion of the landscape, the irrigation controller causes one or more solenoid valves to open so that water flows to their respective sprinklers. When the schedule calls for an end to the irrigation, the irrigation controller causes the solenoid valves to close, stopping the water flow to the sprinklers.

Early irrigation controllers typically included an input interface that was non-removably fixed to the body of the irrigation controller. More recent irrigation controllers include input interfaces that are removably connected with the body of the irrigation controller. For example, U.S. Pat. No. 7,916,458, which is incorporated herein by reference, discloses an irrigation controller which includes a console or face pack which functions as the user control interface for an irrigation system. The face pack includes one or more screens (e.g., touch screens and/or displays) on the front side of the face pack, one or more buttons, knobs, switches, or other user input structures. The face pack is connected to the base portion of the irrigation controller via a hinge assembly. The face pack can rotate about the hinge assembly. The hinge assembly includes release mechanism configured to facilitate separation of the face pack from the base portion of the irrigation controller's body.

In another example, US 2018/0317331 A1, which is incorporated herein by reference, discloses another irrigation controller in which the communications interface system includes one or more removable communications modules and one or more face packs including display screen on the front side of the face pack, one or more buttons, knobs, switches. The communications modules and face packs are configured to removably couple with the housing of the irrigation controller by a release lever and capable of transitioning between the locking configuration and the released configuration.

Notably, in the above examples, one or more display screens, buttons, knobs, switches, or other user input structures are always placed on the front side of the user interface facing the outside of the controller housing. Therefore, if the user would like to simultaneously work with both the wiring of the module connections, which is often at the rear housing of the irrigation controller, as well as the front side of the user interface, the user needs to remove the user interface from the body of the irrigation controller to see the front side of the user interface which includes the display screens, buttons, knobs and switches. In this respect, the user may attempt to hold the user interface with one hand while performing work on the controller's wiring with the other hand, which may be difficult.

Therefore, a need exists to develop a user interface where the front side of the user interface with all the display screens, buttons, knobs, switches, or other user input structures is able to rotate 180 degrees to have it face the inside of the controller housing. This will be beneficial when the user adds or adjusts the wiring of the modular connection and adjusts the programming at the front side of the user interface simultaneously. In this case, the user will be able to see the display screens, buttons, knobs, switches, or other user input structures on the front side of the user interface and the wiring of the module connections at the same time without having to remove the user interface from the body of the irrigation controller.

SUMMARY OF THE INVENTION

One embodiment of the present invention is directed to an irrigation controller having a user interface panel or module that is connected to the controller housing via a joint or hinge that allows the panel to be both swung outward and flipped 180-degrees to face an opposite direction. Hence, the user interface module or panel has a first position facing outwards or away from the interior of the controller housing, and a second position in which the user interface module or panel faces in a opposite, 180-degree orientation so that a user can view both the controls of the user interface module and the interior and components of the irrigation controller.

In one example, the user interface module is pivotally mounted within a frame that is attached to the controller housing via a hinge.

In another example, the user interface module is pivotally mounted on one or more arms that swing outward from the controller housing.

In another example, the user interface module is pivotally mounted on either an upper horizontal member or a lower horizontal member.

In another example, the user interface module has a plurality of posts on the upper and lower ends on both the left and right sides, such that the user interface module can connect to face a first orientation or a second orientation that is 180-degrees to the first.

One embodiment of the present invention includes a mounting bracket that allows a user to first screw the bracket into wall, slide the irrigation controller upwards, and then position a screw through the irrigation controller housing.

One embodiment of the present invention includes an irrigation module that has a first component having a plurality of wire terminals, and a second component containing electrical components such as a processor, communication module, and/or a sensor circuitry. The second component is separable from the first component, allowing for replacement of the second component without the need to remove and reconnect irrigation wires to the irrigation module.

BRIEF DESCRIPTION OF THE DRAWINGS

These and other aspects, features and advantages of which embodiments of the invention are capable of will be apparent and elucidated from the following description of embodiments of the present invention, reference being made to the accompanying drawings, in which:

FIGS. 21, 22, 23, 24, 25, 26, 27, 28, 29, 30, 31, 32, 33, and 34 illustrate various views of an irrigation module that can be separated into two components.

DESCRIPTION OF EMBODIMENTS

Figure 1:
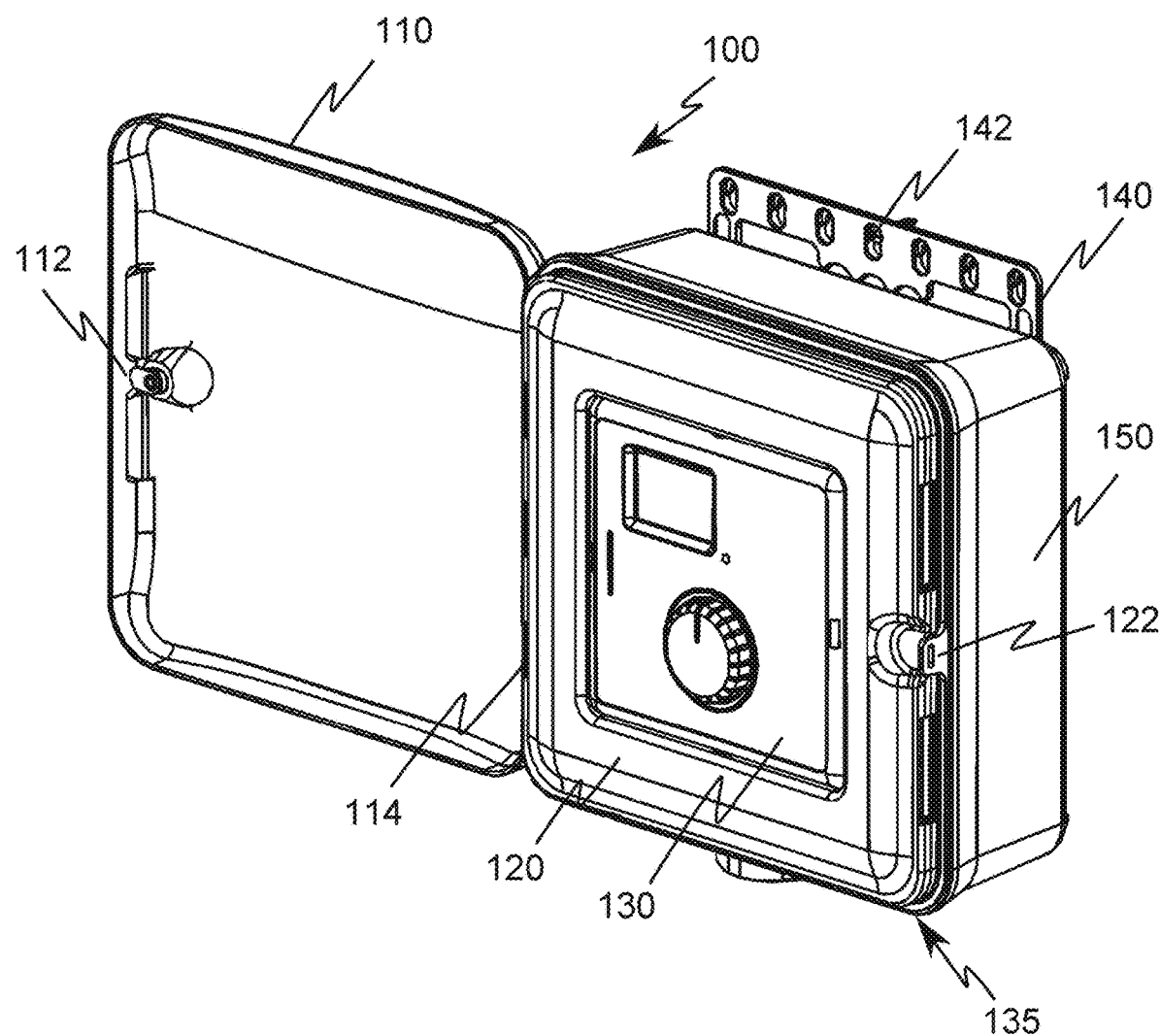
FIG. 1 is a front view of the irrigation controller with the main door 110 open at 180 degrees.

Specific embodiments of the invention will now be described with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the embodiments illustrated in the accompanying drawings is not intended to be limiting of the invention. In the drawings, like numbers refer to like elements. While different embodiments are described, features of each embodiment can be used interchangeably with other described embodiments. In other words, any of the features of each of the embodiments can be mixed and matched with each other, and embodiments should not necessarily be rigidly interpreted to only include the features shown or described.

As described in further detail below, several embodiments disclosed in this specification are generally directed to an irrigation controller having a user interface located on an inner door, panel, or module of the housing. The user interface portion is mounted so that it can be rotated or repositioned 180 degrees so that its controls are facing generally outward from the housing or at least partially towards an interior of the housing. In the first orientation, the user interface is accessible on an outside of the housing so that the user can program the controller when the door or panel the interface is positioned on is in a closed position. In the second orientation, the user interface is accessible when the door or panel the interface is positioned on is open to expose the wires within the housing, thereby allowing adjustment of the wiring and access to the user interface. Since the installation process of adding new irrigation modules, irrigation valves, and/or irrigation sprinklers typically requires access to both the interior of the housing and the user interface, this rotating or repositionable interface can allow for a quicker and easier setup process.

FIGS. 1-10 illustrate one embodiment of an irrigation controller 100 in which the user interface can be repositioned or rotated to generally opposite positions. Specifically, the irrigation controller 100 includes a user interface panel or module 130 that can be positioned in a first position seen in FIGS. 1 and 2, and a second position seen in FIG. 5. In the first position, the user interface (i.e., the input buttons and display seen in FIG. 1) faces outward from the rear housing 150, allowing the user to access the user interface when the user interface module 130 and its supporting frame 120 are closed over the interior of the housing (i.e., controls are facing outward). In the second position, the user interface module 130 is rotated so that the user interface faces in a different (e.g., opposite direction) relative to its supporting frame 120, thereby allowing the user to access the interior of housing 150 and the user interface of the module 130 without need to move the frame 120. Hence, the user can more efficiently adjust components within the housing 150 while simultaneously viewing and accessing the user interface.

Figure 2:
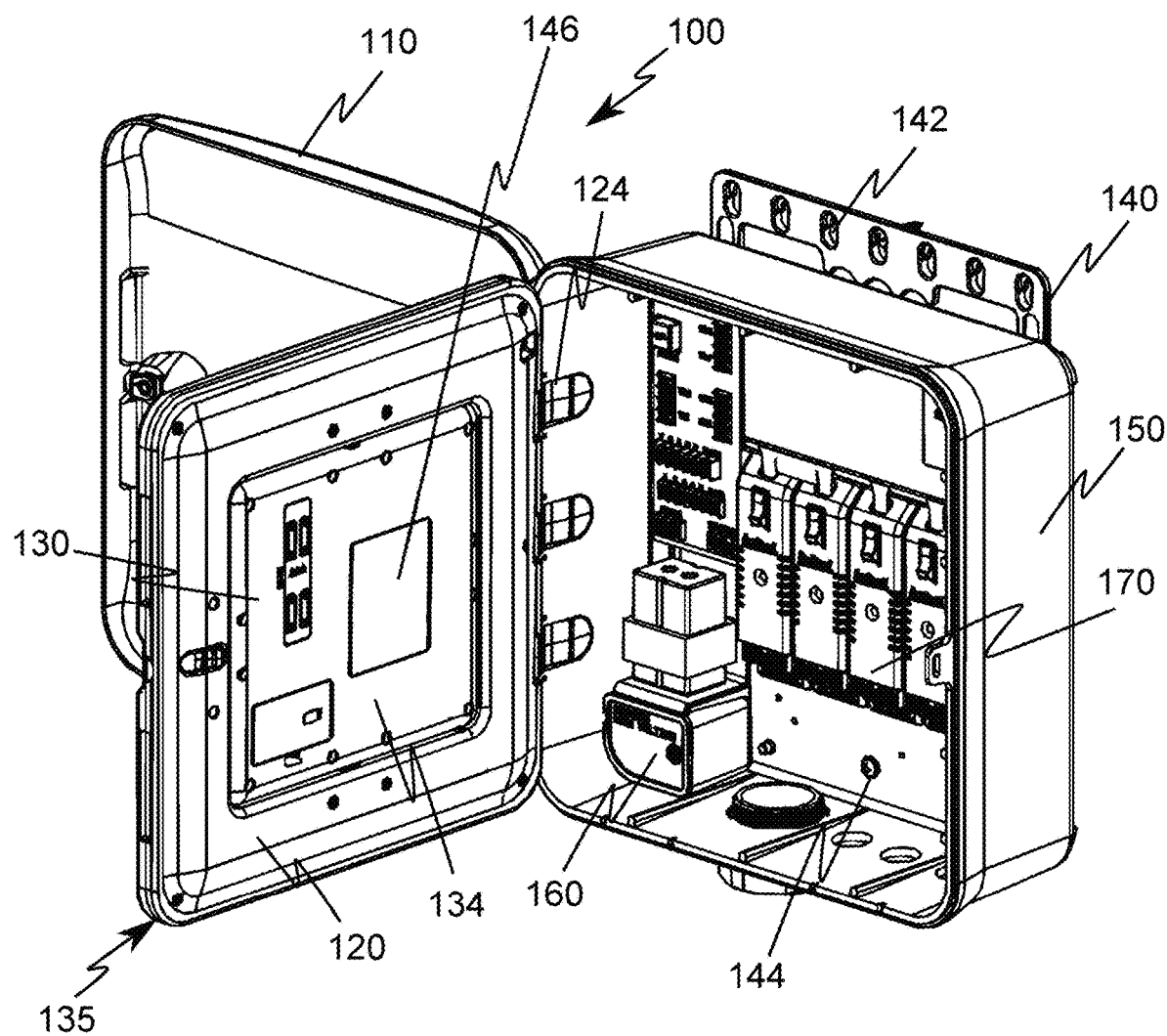
FIG. 2 is a perspective view of the irrigation controller with the main door 110 open at 180 degrees and the inner door 135 open at 90 degrees and the user interface module 130 remains at 0-degree angle with respect to the inner door 135.

As seen best in FIGS. 1 and 2, the irrigation controller 100 includes an inner door or panel 135 that comprises the supporting frame 120 and the user interface module 130. The supporting frame 120 may be attached via hinges 124 to a side of the rear housing 150 so that the inner panel 135 can swing open and closed over the interior of rear housing 150. A detent or latch mechanism 122 on the opposite side of the hinges 124 can help engage or maintain the inner panel 135 in its closed position.

Optionally, an outer housing cover 110 is attached to the rear housing 150 via hinges 114. This allows the housing cover 110 to swing over the inner door panel 135 and thereby provide further protection to its components from dust, dirt, water, and other elements. The outer housing cover 110 may also include a latch mechanism 112 to help maintain a closed position with the rear housing 150.

In FIG. 1, the outer housing cover 110 is open at a 180 degree angle with respect to the rear housing 150 and the inner door panel 135 is in a closed position with respect to the rear housing 150. In FIG. 1, the inner door panel 135 and user interface module 130 are positioned at a 0-degree angle with respect to the rear housing 150.

FIG. 2 further illustrates a front view of the irrigation controller 100 with the outer housing cover 110 open at 180 degrees and the inner door panel 135 rotated at 90 degrees clockwise with respect to the rear housing 150. In FIG. 2, the user interface module 130 remains at a 0-degree angle with respect to the inner door panel 135 and a back side 134 of the user interface module 130 (i.e., without controls) faces generally toward the inside of the rear housing 150.

Figure 3:
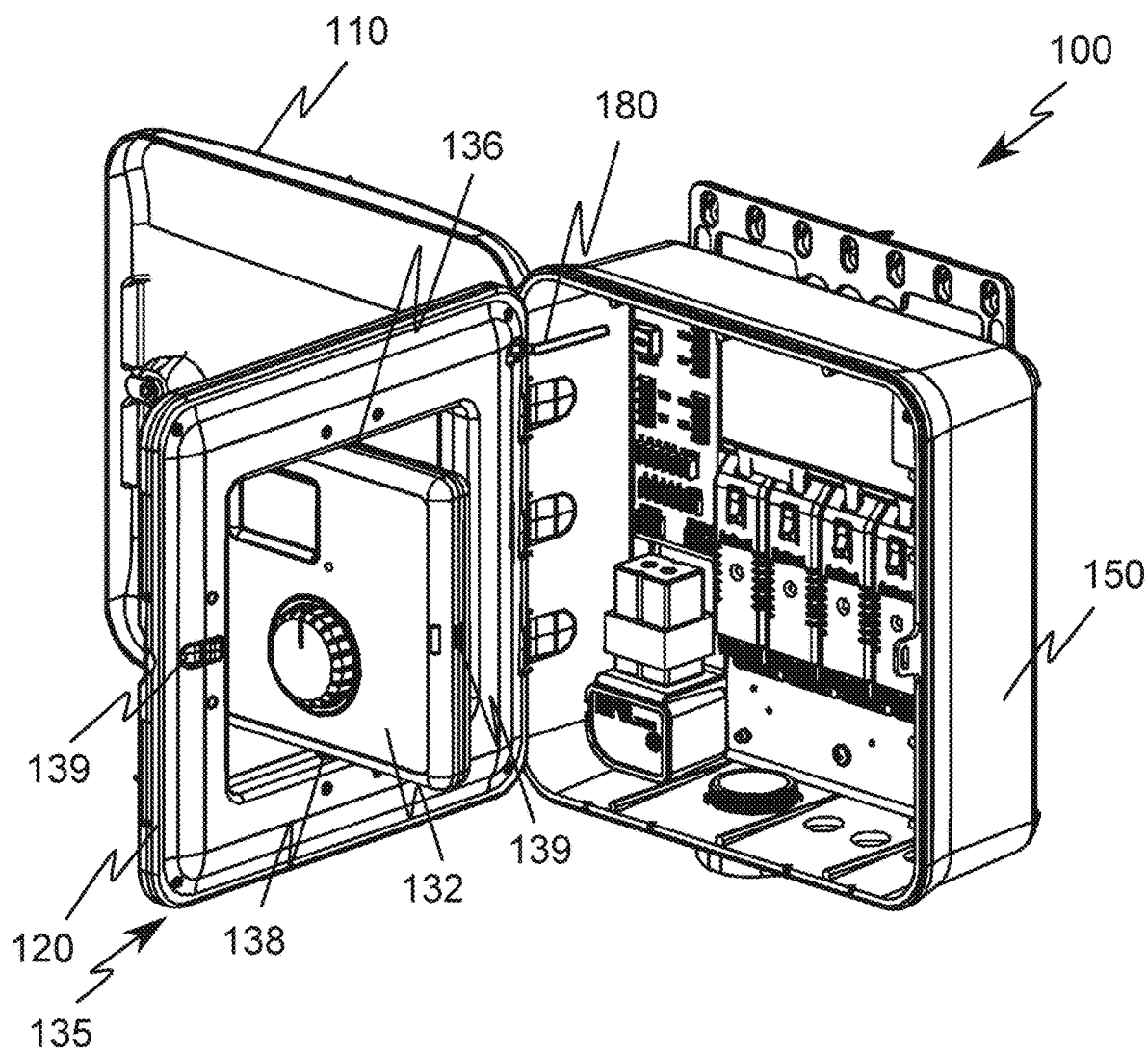
FIG. 3 is a perspective view of the irrigation controller with the main door 110 open at 180 degrees and the inner door 135 open at 90 degrees and the user interface module 130 rotated counterclockwise at 90 degrees with respect to the inner door 135.

In FIG. 3, the user interface module 130 is rotated counterclockwise at 90 degrees with respect to the frame 120 of the inner door 135 and the front side 132 of the user interface module 130, with its display screen and knob, faces the inside of the rear housing 150.

Figure 5:
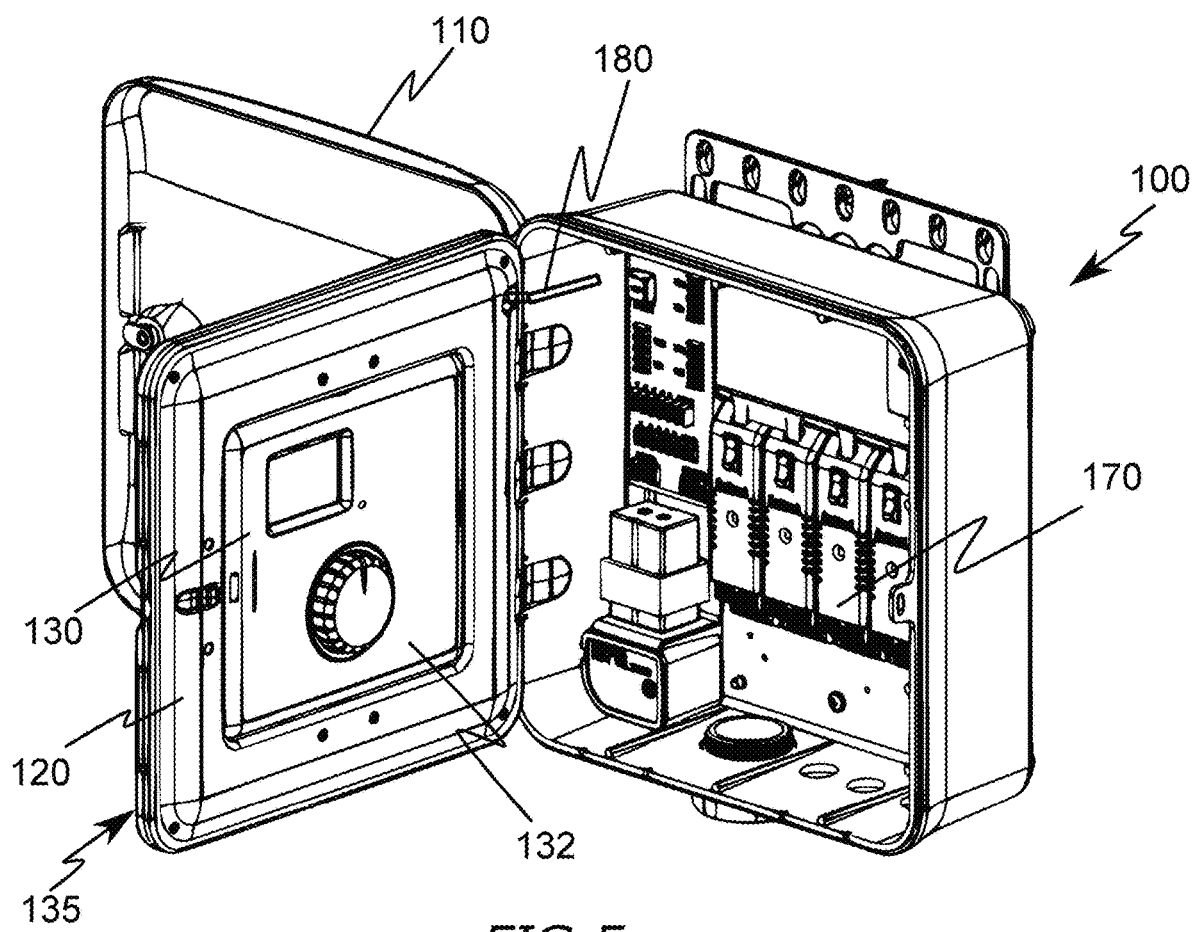
FIG. 5 is a perspective view of the irrigation controller with the main door 110 open at 180 degrees and the inner door 135 open at 90 degrees and the user interface module 130 rotated counterclockwise at 180 degrees with respect to the inner door 135.

FIG. 5 is a perspective view of the irrigation controller 100 with the outer housing cover 110 open at 180 degrees and the inner door 135 open at 90 degrees relative to the housing 150. The user interface module 130 is rotated counterclockwise at 180 degrees with respect to the frame 120 of the inner door 135 which allows the user interface module 130 to display the front side 132.

In FIG. 5, the user interface module 130 rotates counterclockwise at 180 degrees with respect to the frame 120 of the inner door 135 in FIG. 2 and the front side 132 of the user interface module 130, with its display screen and knob, generally opposes the inside of the rear housing 150. The positions of the outer housing cover 110 and the inner door 135 remain unchanged in FIG. 5 with respect to the FIGS. 2 and 3.

The 180-degree counterclockwise rotation of the user interface module 130 with respect to the frame 120 of the inner door 135 allows the user to see the display screen and control knob on the front side 132 of the user interface module 130 and the wiring to the irrigation modules 170 at the same time without having to remove the user interface module 130 from the rear housing 150 of the irrigation controller 100.

The user interface module 130 optionally includes a stop mechanism to prevent over rotation. Since a communication cable 180 may be used to connect the user interface module 130 with components within the rear housing 150, limiting rotation within only 180 degrees may be helpful to prevent unwanted twisting or other damage to the cable 180.

Figure 4A:
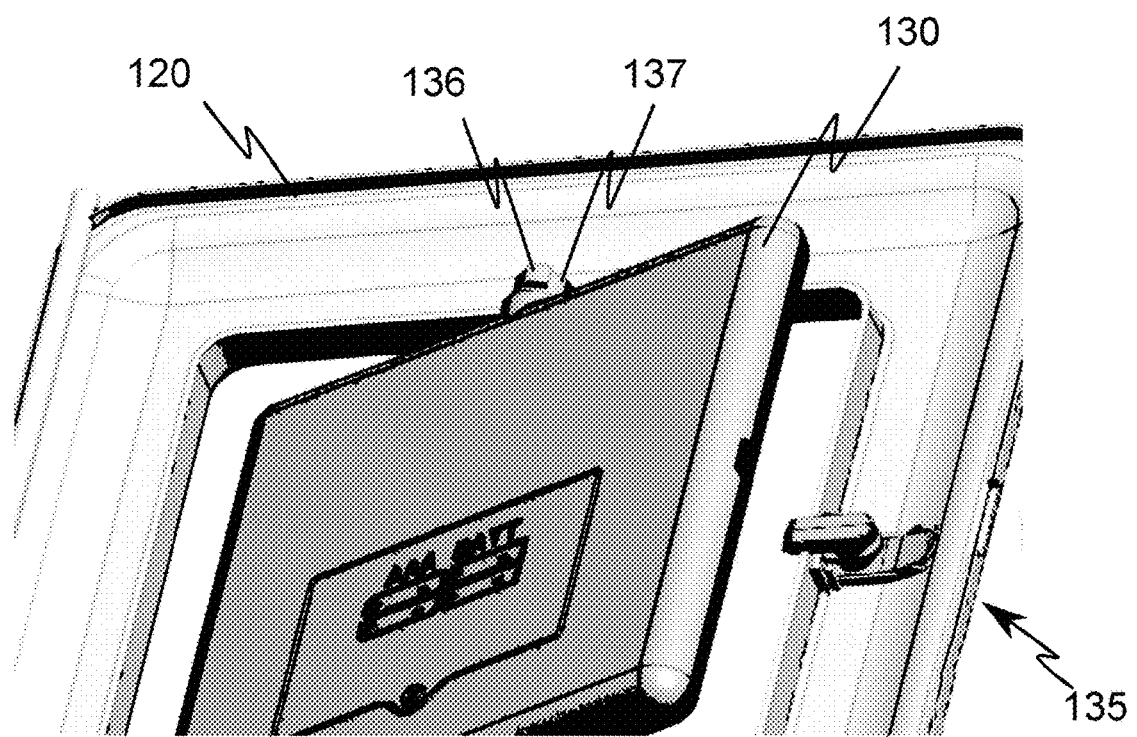
FIGS. 4A and 4B are enlarged view of the upper rigid stop 136 and lower rigid stop 138.
Figure 4B:
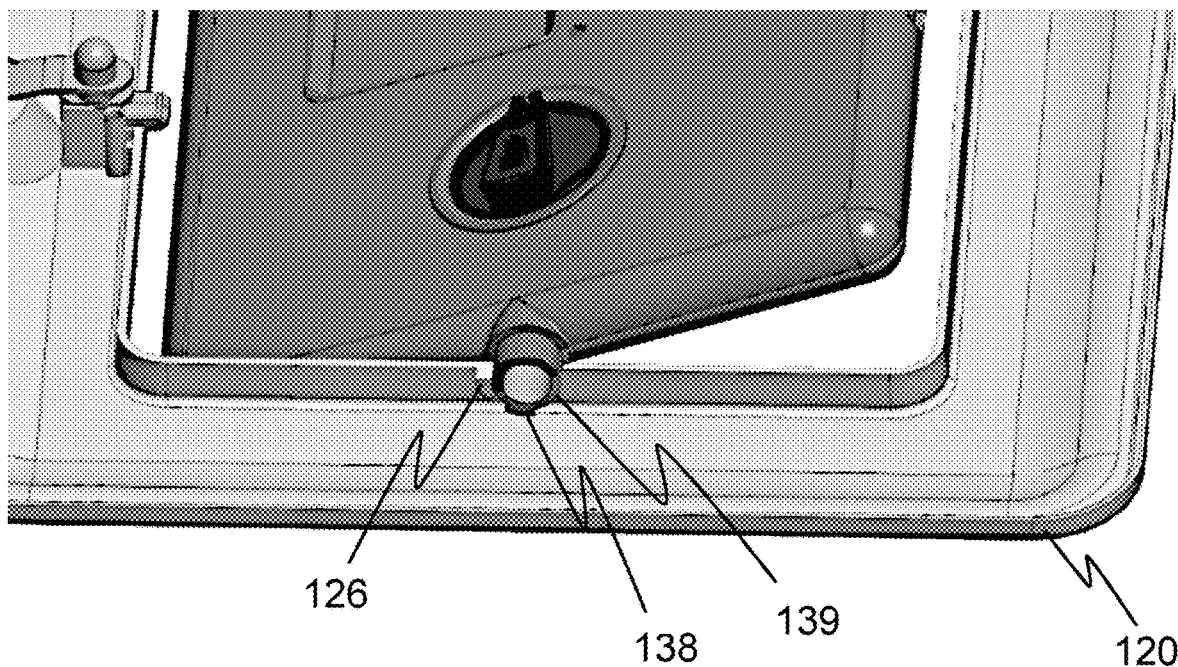

In one embodiment, the stop mechanism includes an upper rigid stop 136 that juts out from the surrounding surface of post 137 and a lower rigid stop 138 that similarly juts out from a surrounding surface on post 139, as seen best in FIGS. 4A and 4B (illustrated with a portion of the frame removed). The frame 120 of the inner door 135 includes an upper raised portion and lower raised portion 126 positioned at a similar elevation respectively as the upper rigid stop 136 and the lower ridge stop 138. It can be understood from FIG. 4B that the free rotation of the lower rigid stop 138 around its axis is restricted when it contacts the raised portion 126 positioned on the frame 120 of the inner door 135. A similar mechanism is also included with the upper rigid stop 136 in FIG. 4A. Hence, the rotation is limited beyond 180 degrees. This stop mechanism can be position only on the post 137, only on the post 139, or on both.

In some embodiments, the user interface module 130 is pivoted within the frame 120 of the inner door 135, with the upper rigid stop 136 and lower rigid stop 138, and may be locked at 0 degree and approximately 180 degrees, providing support while operating the user interface module 130.

A sensor (146) may also be included to sense one or more rotational positions of the user interface module 130 with respect to the frame 120 of the inner door 135, such as its 0-degree position facing outward or its 180-degree position facing the opposite direction. For example, this sensor 146 can be a switch or a Hal effect sensor. The sensor data can be used to turn on lights positioned inside the rear housing 150 for illuminating the interior of the rear housing 150 to facilitate changes or additions to the modules 170 or can be used to change a menu or display on the user interface module 130. Alternately, a button or switch may be located on the user interface module 130 to trigger the light to turn on or off.

The rear housing 150 of the irrigation controller further includes a power transformer 160 and a plurality of removable irrigation modules 170 inside the rear housing 150. Each irrigation module 170 typically has a plurality of irrigation terminals (e.g., screw terminals) that are configured for connected to wires connected to various irrigation devices (e.g., an irrigation valve connected to one or more sprinklers). Typically, irrigation controllers will be sold with only one or two modules 170, but the user can purchase additional modules as needed to provide the number of irrigation terminals suitable for the number of devices needed to irrigate their landscape.

Figure 6:
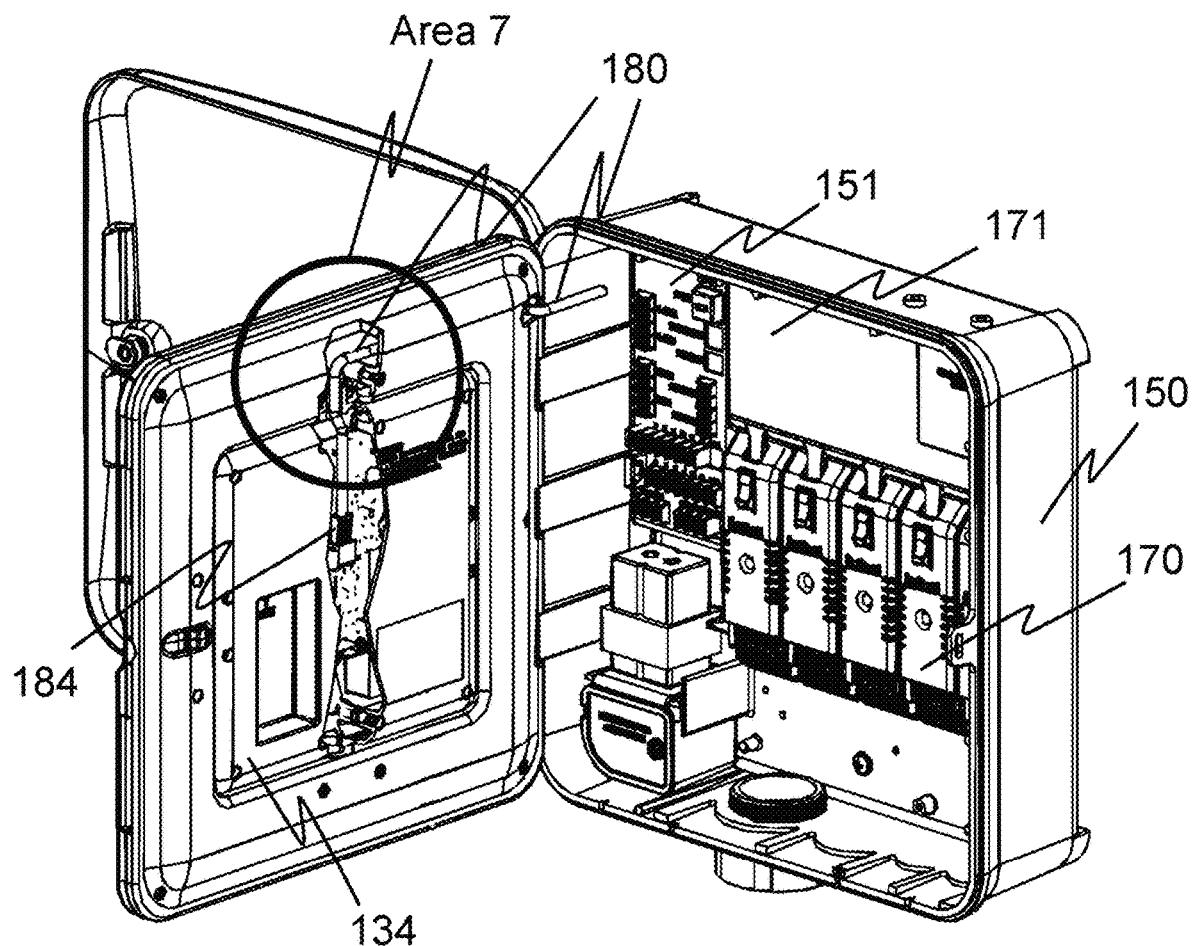
FIG. 6 is a perspective view of the irrigation controller 100 and illustrates cable connection between the user interface module 130 and the modules 170.

FIGS. 6-10 illustrate various aspects of the wiring supplying power and/or data between the user interface 130 and the electrical components inside the rear housing 150. As seen in FIG. 6, the user interface module 130 is connected to the circuits 151, backplane electrical components 171, and irrigation modules 170 through communication cable 180. The communication cable 180 is connected at one end with the user interface module 130 with a wire connector 182 and wire receptacle 184 (e.g., RJ45), and at the other end with the circuit boards 151 of the housing that connect to the irrigation modules 170, positioned inside the rear housing 150. As seen best in FIG. 4A, the communication cable 180 passes through a hollow inner portion of the post 137 as it enters inside the user interface module 130.

Figure 7:
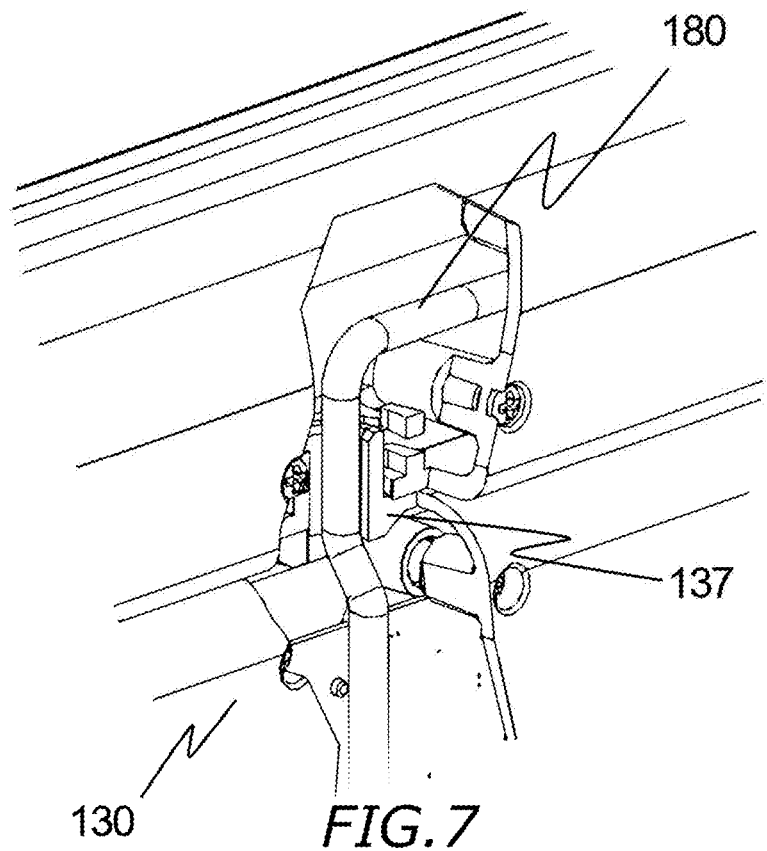
FIG. 7 is an enlarged view of the communication cable 180 inside the user interface module 130.
Figure 8:
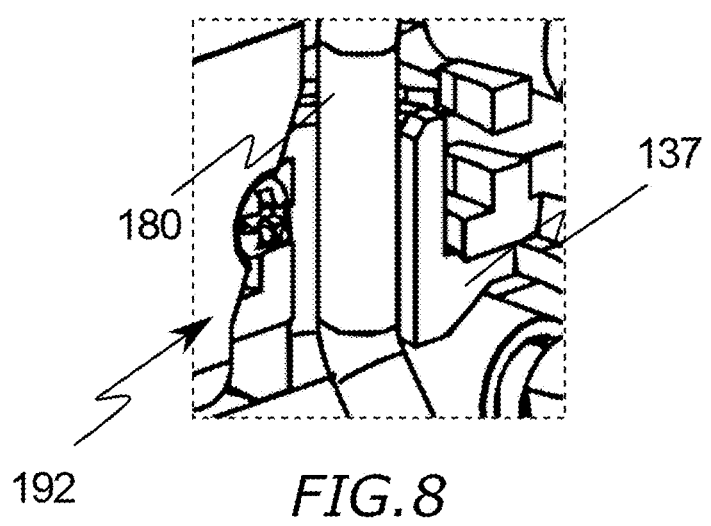
FIG. 8 is a back view of the inner door 135 and the backside 134 of the user interface module 130 and illustrates cable connection between the user interface module 130 and the irrigation modules 170.
Figure 9:
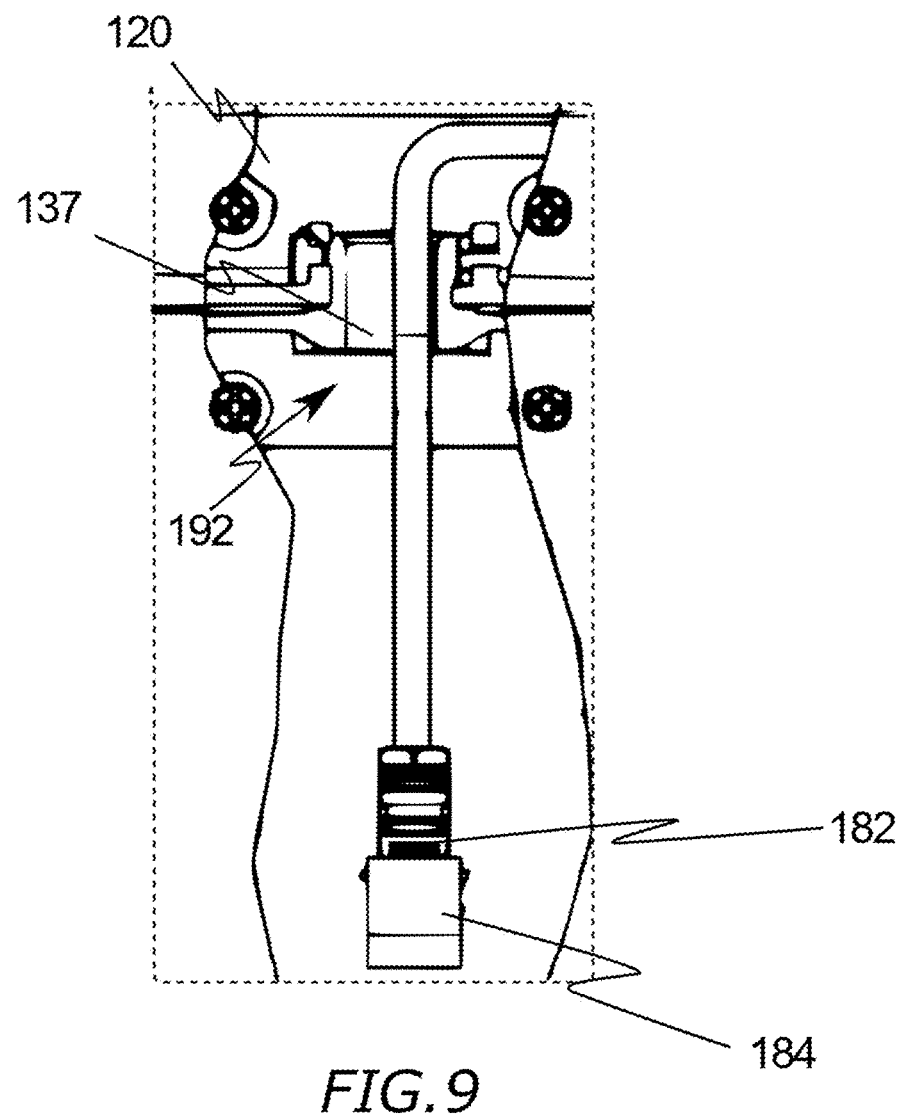
FIG. 9 is a back view of the inner door 135.
Figure 10:
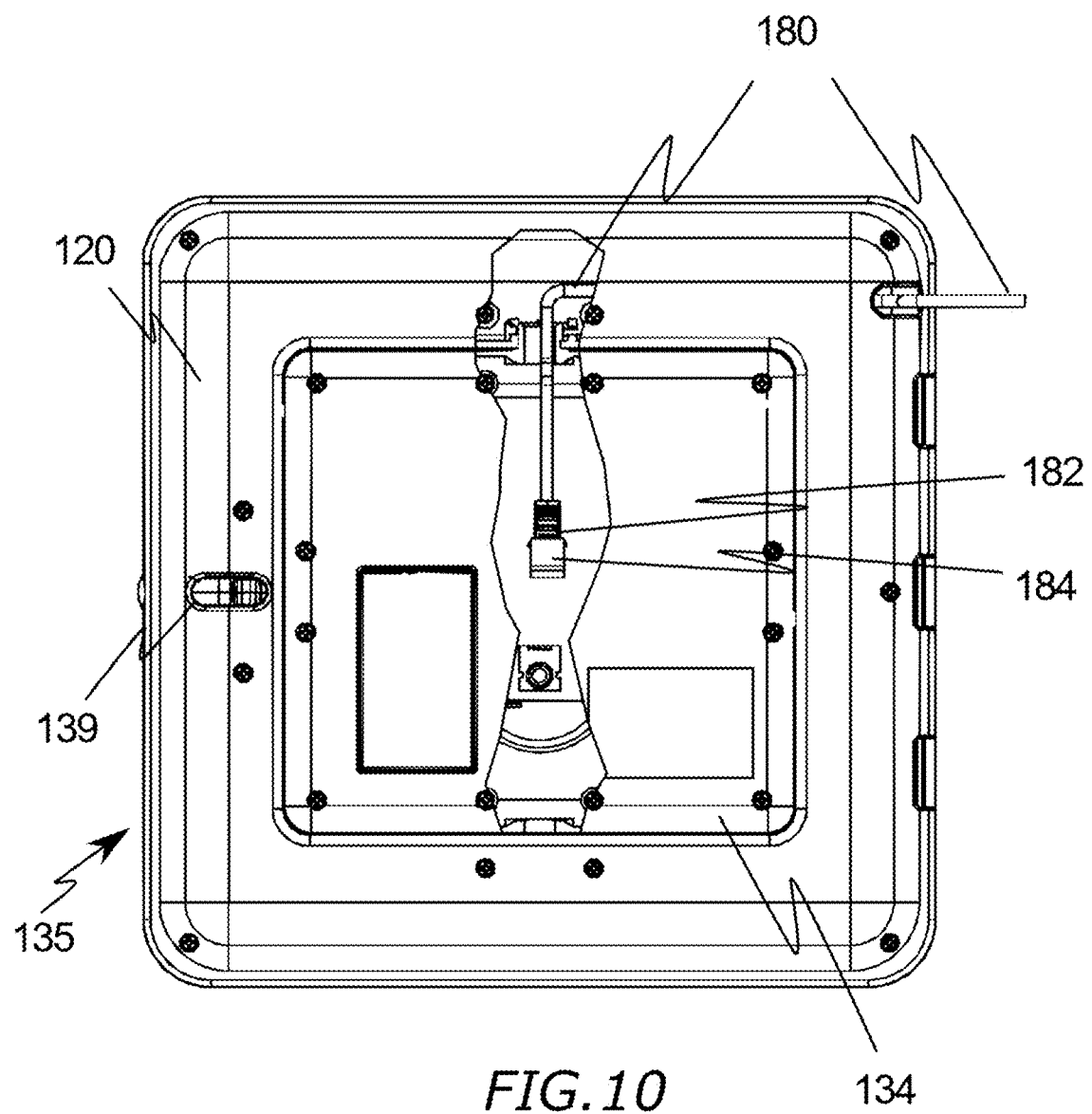
FIG. 10 is a back view of the inner door 135.

FIG. 7 illustrates an enlarged view of the communication cable 180 inside the user interface module 130. The communication cable 180 passes through the user interface module 130 and connects to the wire receptacle 184 (shown in FIG. 10) inside the user interface module 130. In FIG. 8, the communication cable 180 is seen inside the user interface module 130 at the junction of the rotating joint 192, positioned through post 137 and into the hollow portion of the frame 120.

As the user interface module 130 rotates from 0 to 90 to 180 degrees, the communication cable 180 twists. Preferably, the cable 180 is provided enough slack to allow this twisting without undue strain on the cable or other components. The upper ridge stop 136 and lower ridge stop 138 limit further rotation beyond 180 degrees in a single rotational direction and thereby prevent the wire from becoming damaged.

However, the connection between the user interface module 130 and the module connections 170 is not limited to communication cable 180. In some embodiments, the user interface module 130 and the module connections 170 may be wirelessly connected. For example, the user interface module 130 and the module connections 170 may be connected through Bluetooth, xbee radio, WIFI, or similar protocols.

In some embodiments, a wireless connection is preferred because this will enable the user to remove the user interface module 130 and program/operate the irrigation controller 100 while the user interface module 130 is not physically connected. The wireless user interface module 130 may also be used to transfer irrigation programs from one irrigation controller to another.

In another embodiment, the frame 120 of the inner door 135 may include a release mechanism to release the posts 137 and 139, and thereby remove the inner door 135 entirely.

Figure 11:
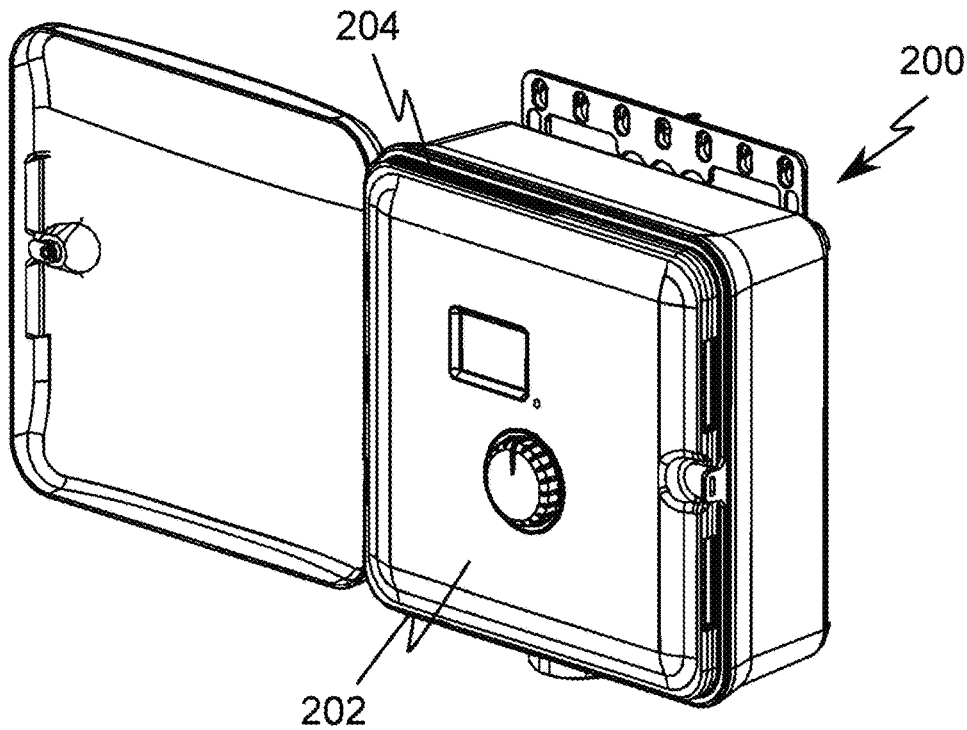
FIGS. 11, 12, and 13 illustrates another embodiment of an irrigation controller with a user interface that rotates.
Figure 12:
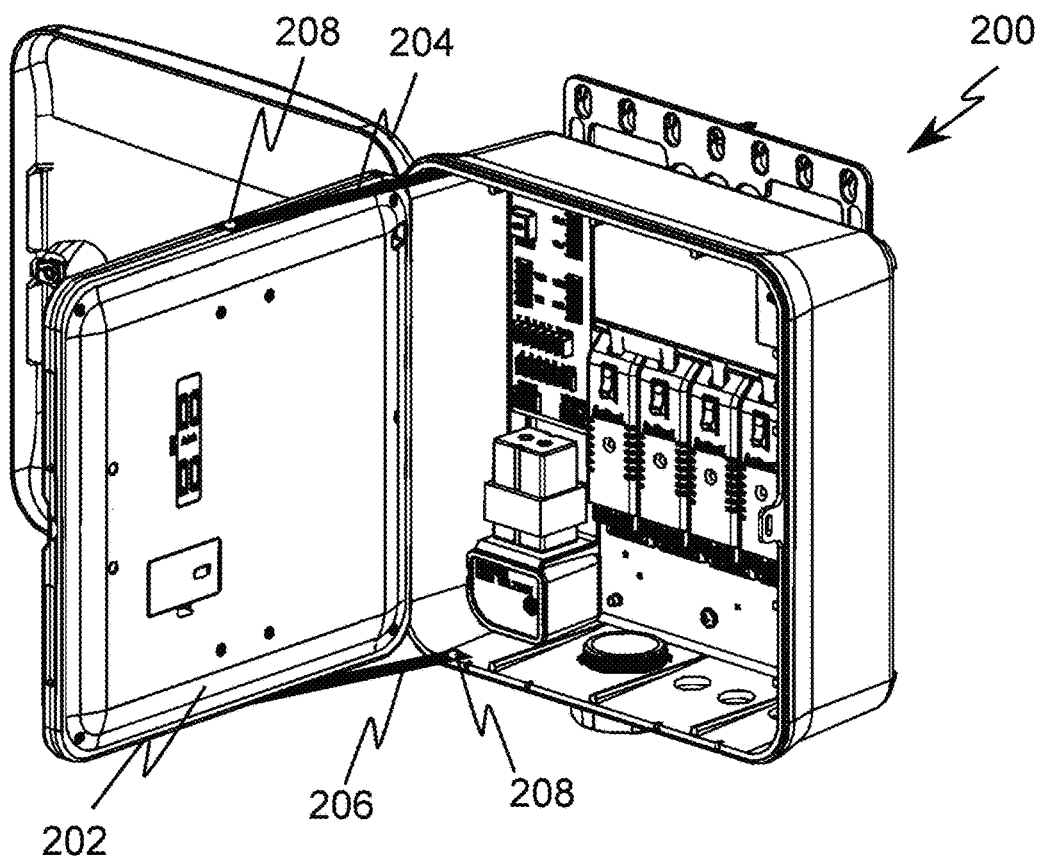
Figure 13:
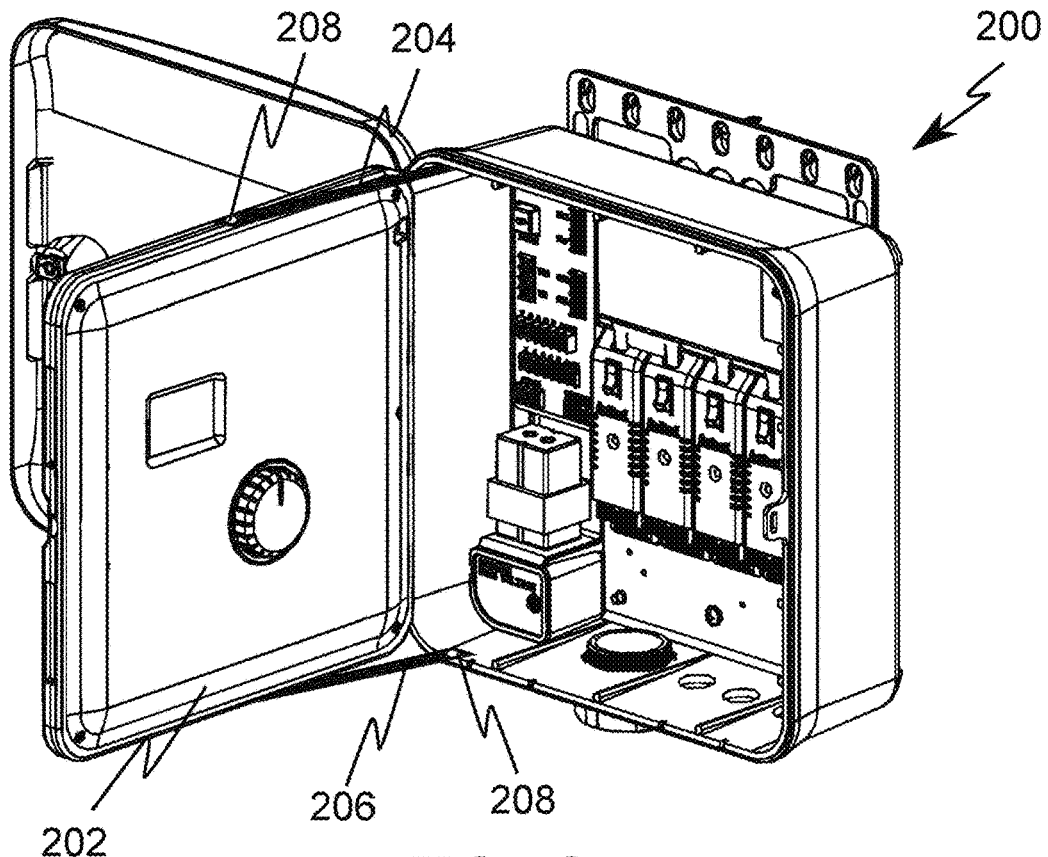

FIGS. 11, 12, and 13 illustrate an alternate embodiment of an irrigation controller 200 with a rotating user interface module 202 that is generally similar to the previously described irrigation controller 100. However, the user interface module 202 has a connection mechanism that can include one or more pivotally mounted arms that allow at least 180-degree rotation. Specifically, an upper arm 204 is mounted via pivot connection 208 near a middle of the top surface of the user interface module 202, as well as at pivot connection 208 near an upper left inner surface of rear housing (not shown). A lower arm 206 is mounted via pivot connection 208 near a middle of the lower surface of the user interface module 202 and near a lower left surface of the rear housing. Hence, the user interface module 202 can be rotated around 180 degrees (FIG. 13) from its outward starting location (FIG. 11) while the user views the interior of the rear housing.

The arms 204 and 206 are composed of a rigid material, such as metal, and can be relatively flat so that the arms 204, 206 can fold into the rear housing. While two arms 204 and 206 are preferable, only a single arm 204 or 206 is also possible.

Figure 14:
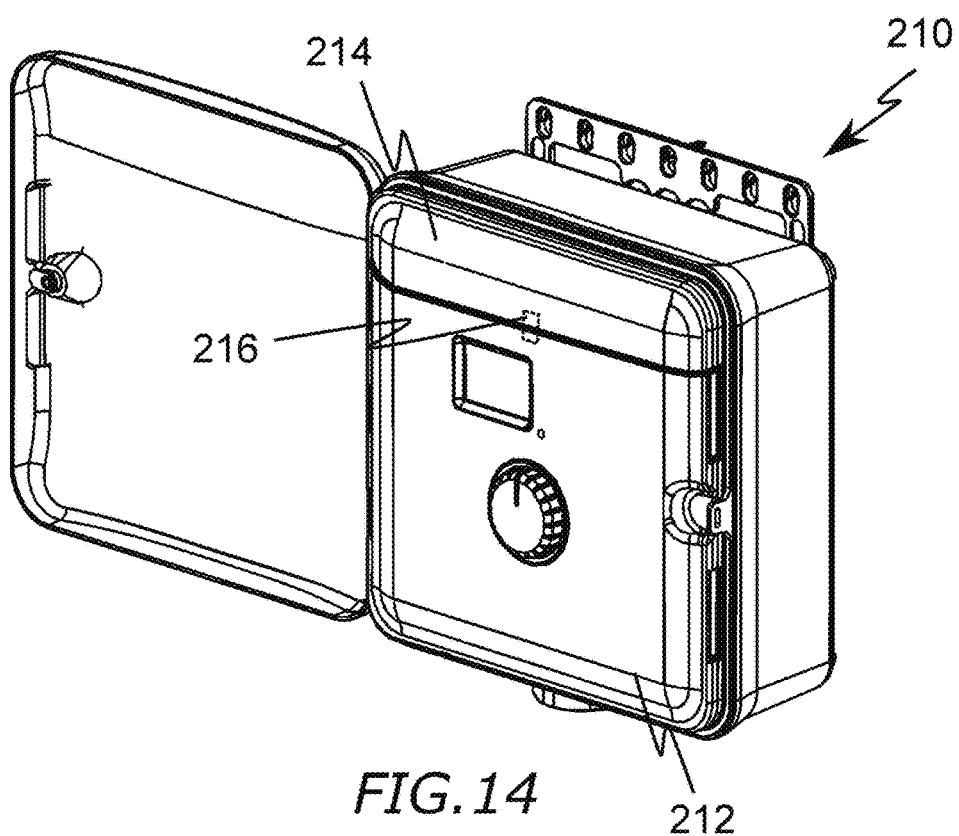
FIGS. 14 and 15 illustrates another embodiment of an irrigation controller with a user interface that rotates.
Figure 15:
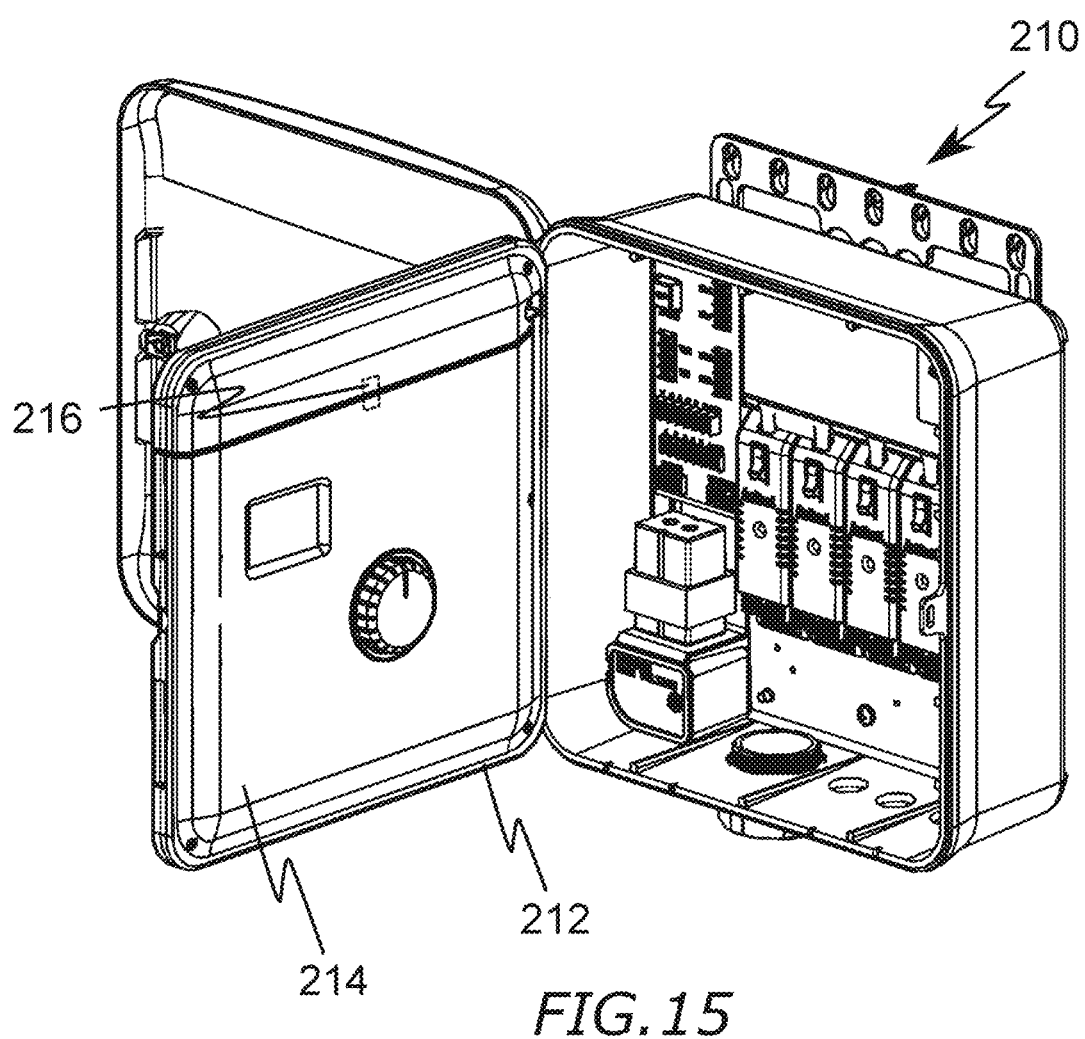

FIGS. 14 and 15 illustrate another embodiment of an irrigation controller 210 with a rotating user interface module 212 that is generally similar to the previously described irrigation controller 100. However, the user interface module 212 has a connection mechanism that allows it to rotate relative to a horizontal frame member 214. The frame member 214 is attached to the left side of the rear housing via a hinge so that it can swing out from the rear housing. The user interface module 212 is connected to the horizontal frame member 214 in a manner that allows it to rotate relative to the frame member 214. For example, a pivot post member 216, similar to those previously described for irrigation controller 100, can be connected near a middle of the top surface of the user interface module 212 and near a middle of the bottom surface of the horizontal frame member 214. As seen in FIG. 15, after both the horizontal frame member 214 and the user interface module 212 are opened to expose the interior of the rear housing, the user interface module 212 can then be rotated to a desired 180 degree position.

Alternately, the horizontal frame member 214 can be located along the bottom of the rear housing and the user interface module 212 can be pivotally attached to a top of the horizontal frame member 214.

Figure 16:
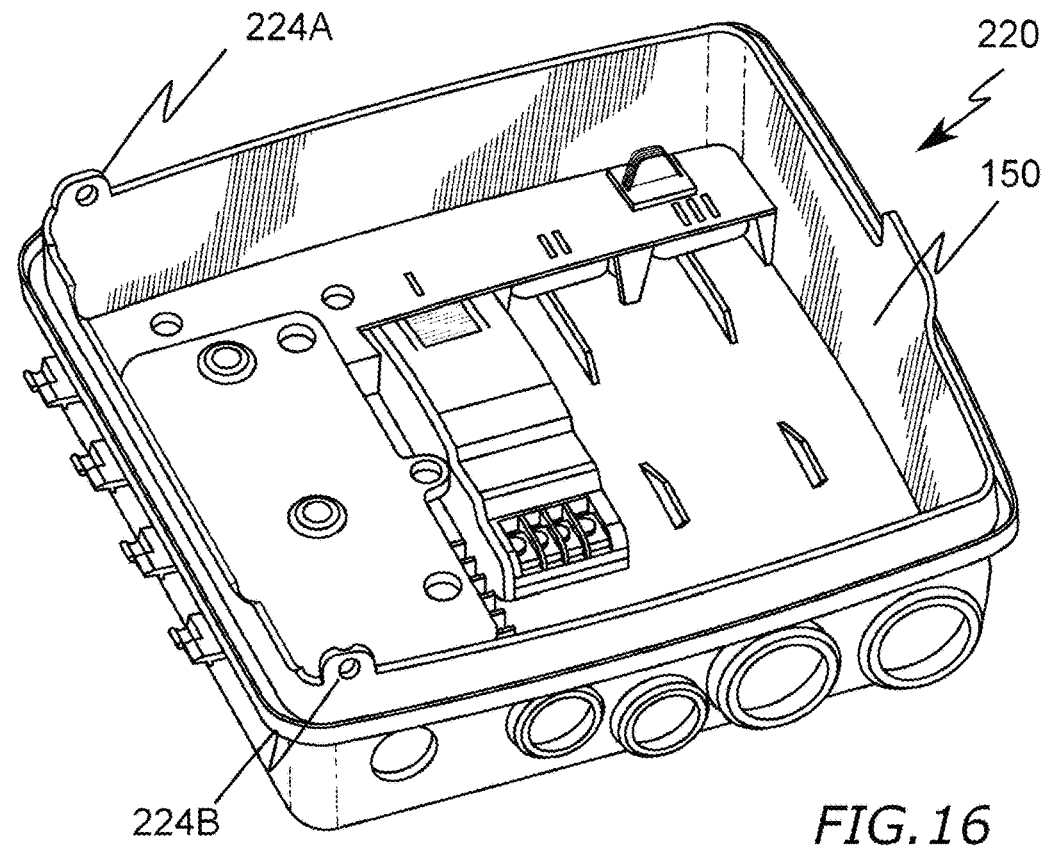
FIGS. 16 and 17 illustrates another embodiment of an irrigation controller with a user interface that rotates.
Figure 17:
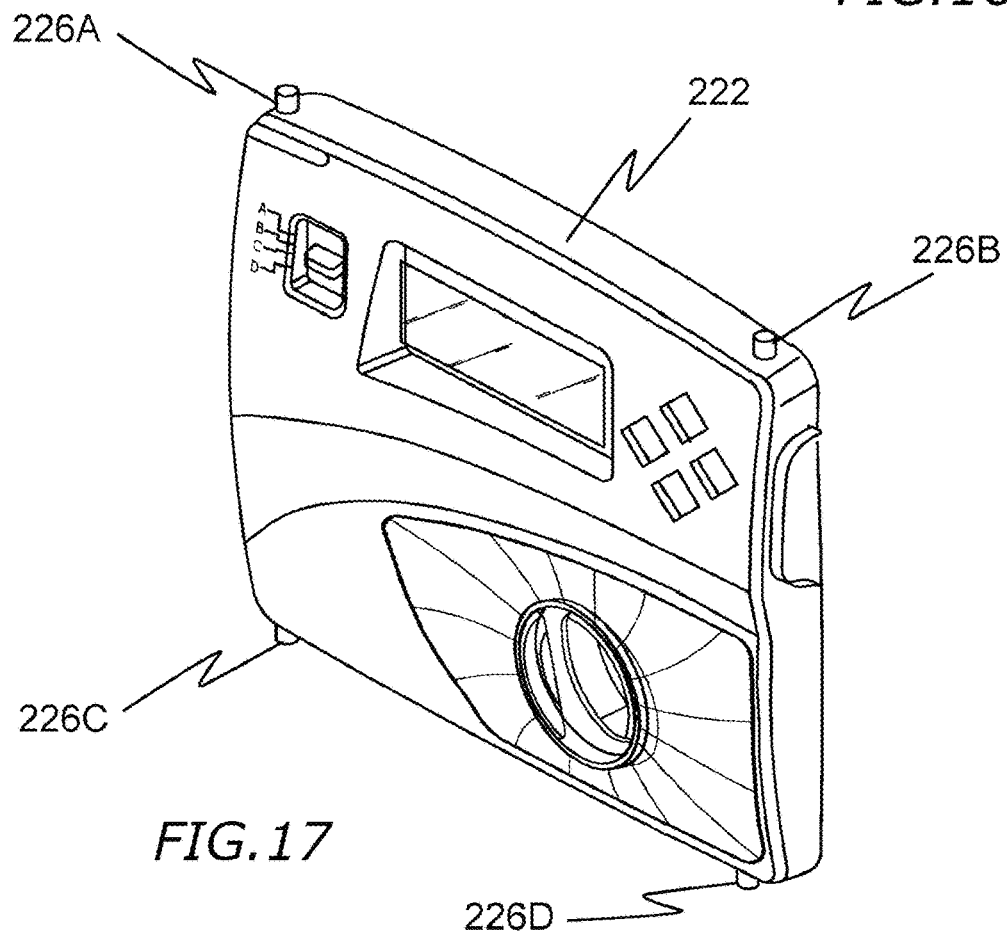
Figure 18:
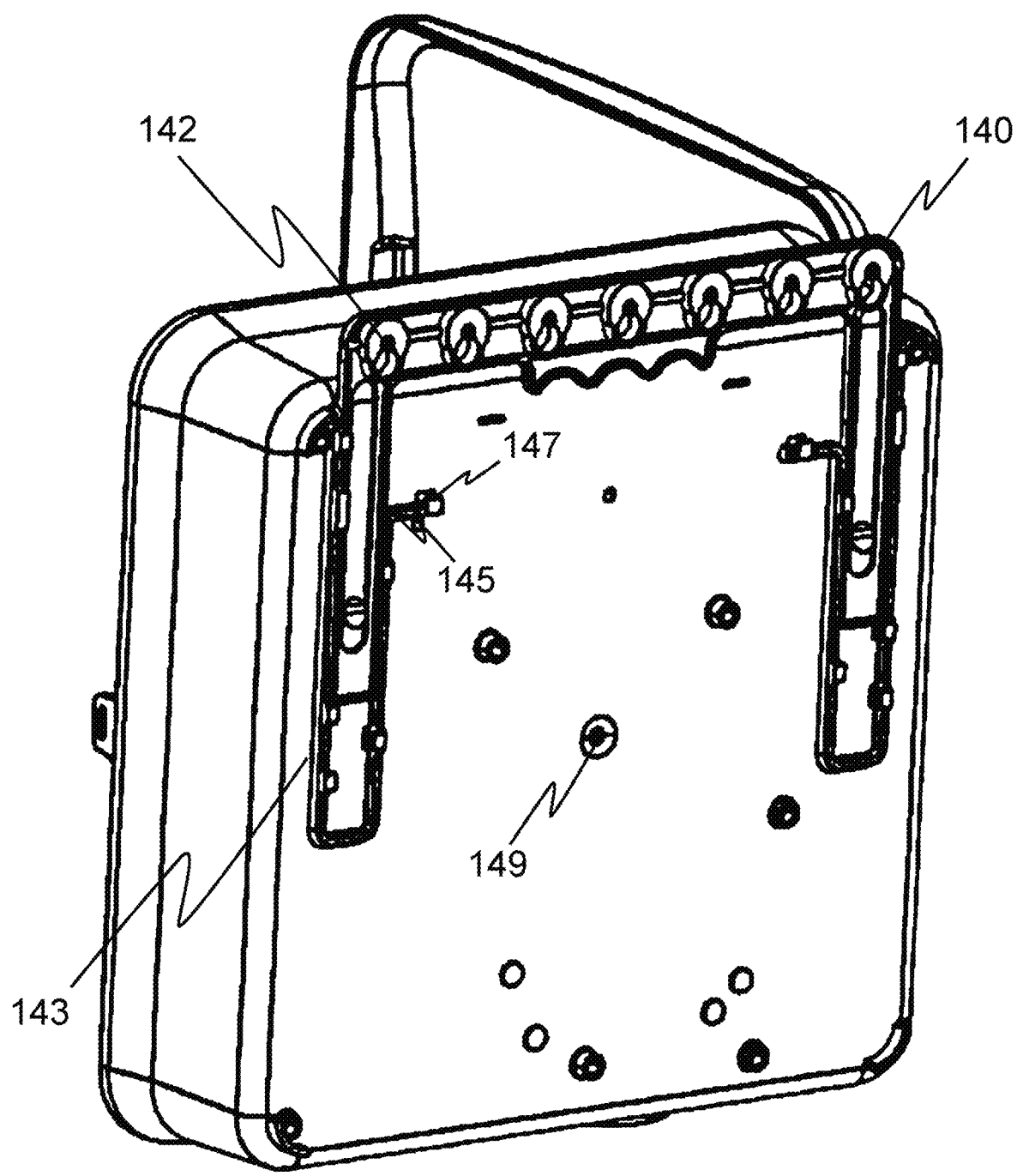
FIGS. 18, 19, and 20 illustrates another embodiment of an irrigation controller with a user interface that rotates.
Figure 19:
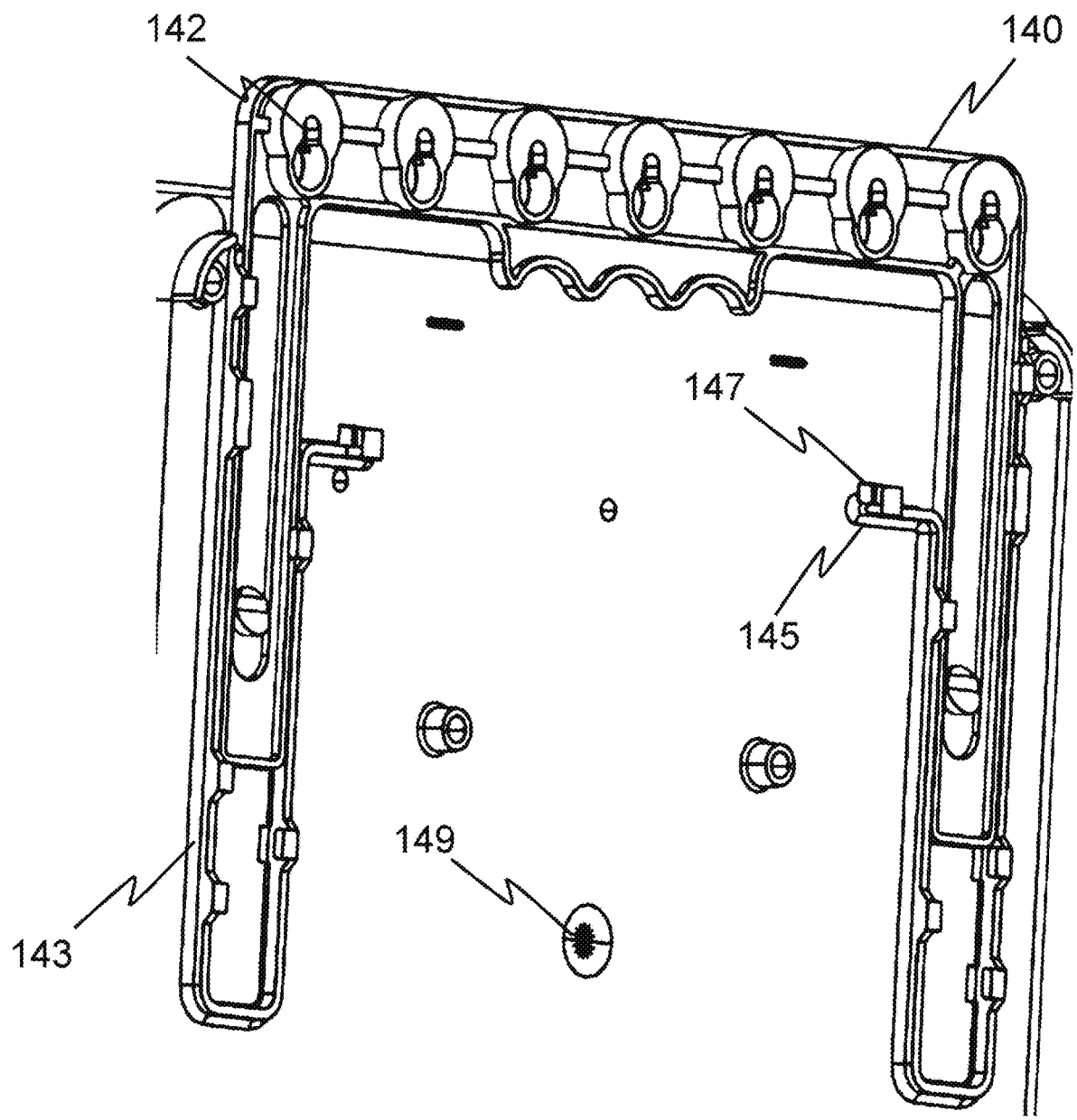
Figure 20:
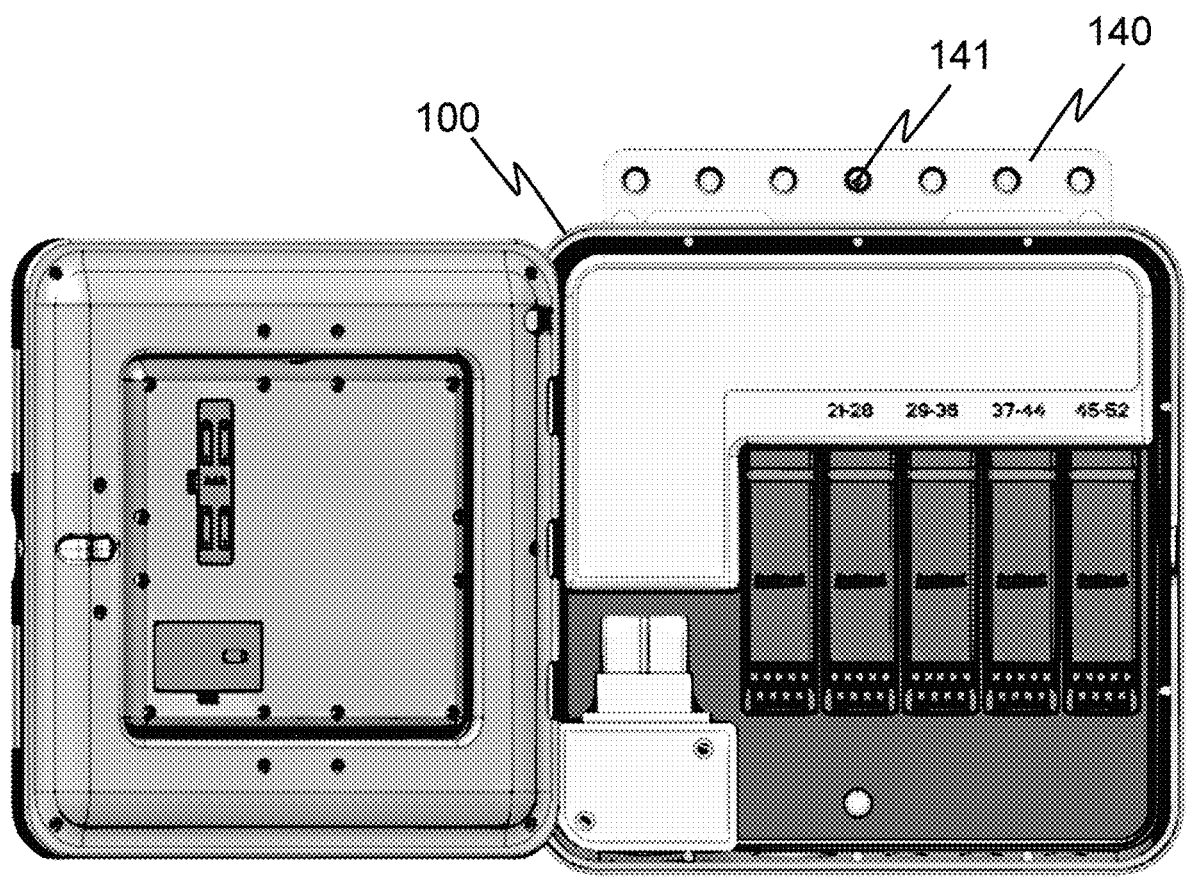
Figure 21:
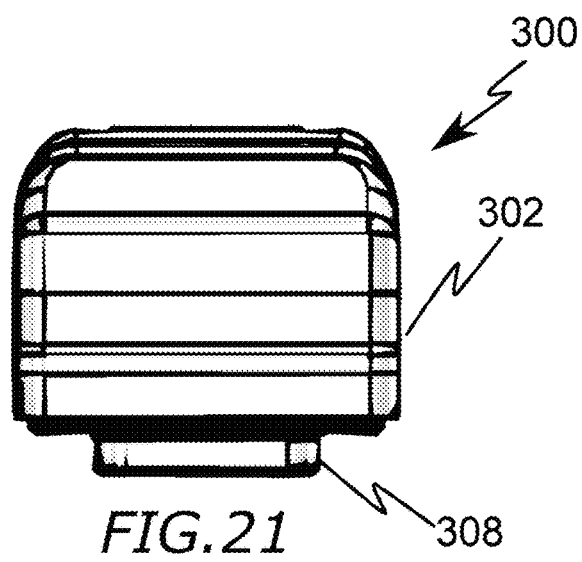
Figure 22:
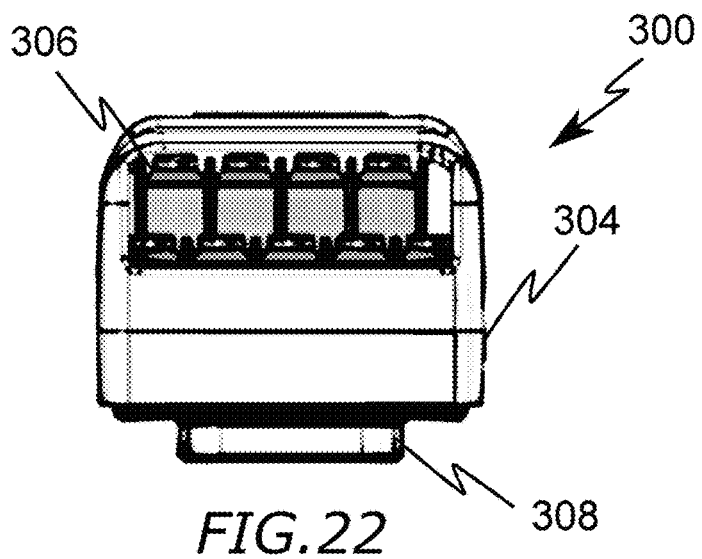
Figure 23:
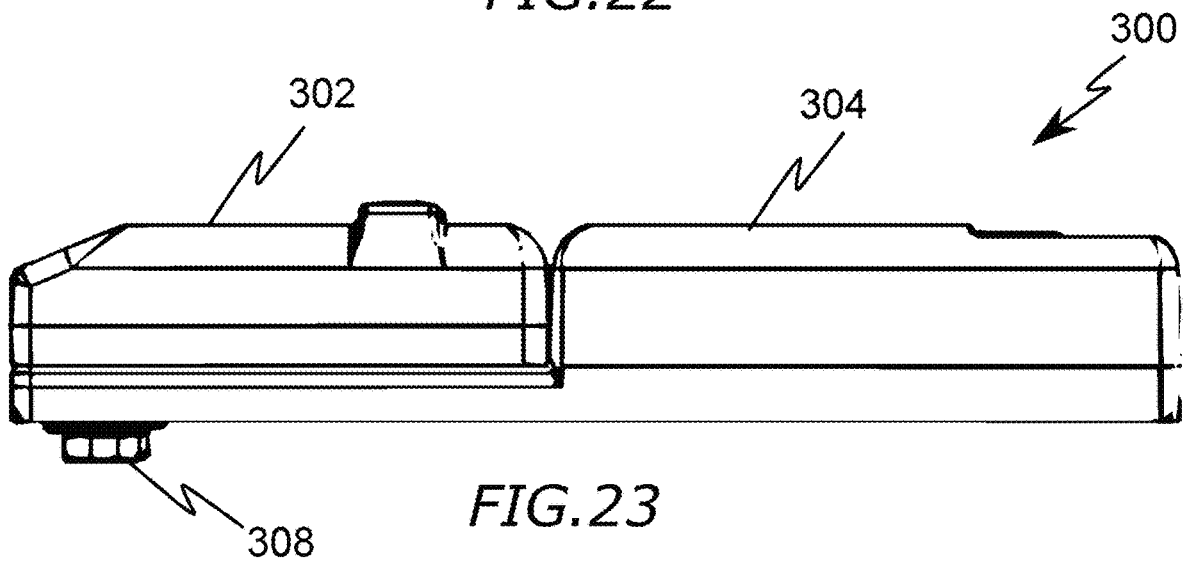
Figure 24:
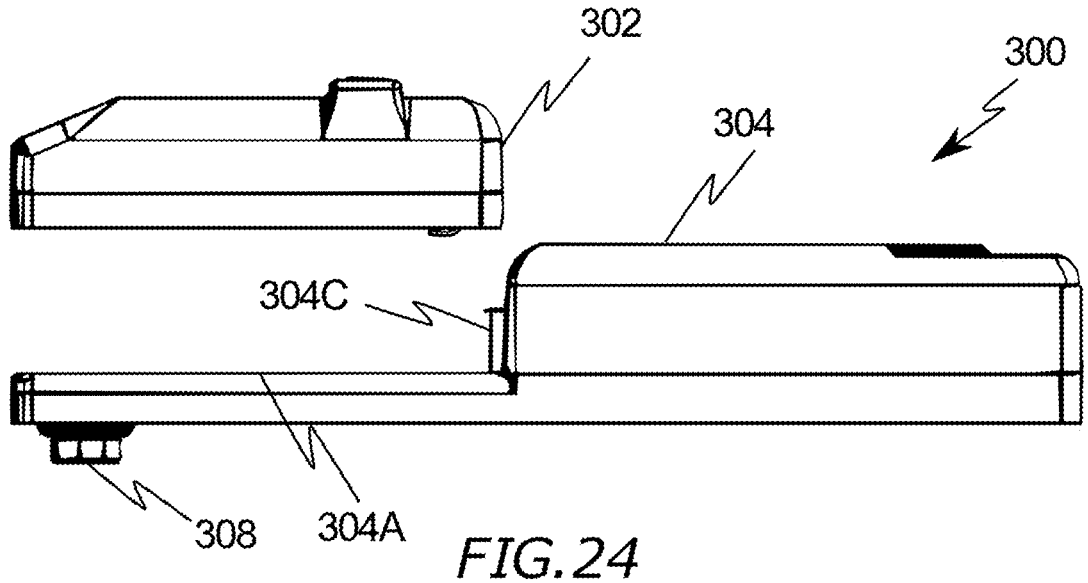
Figure 25:
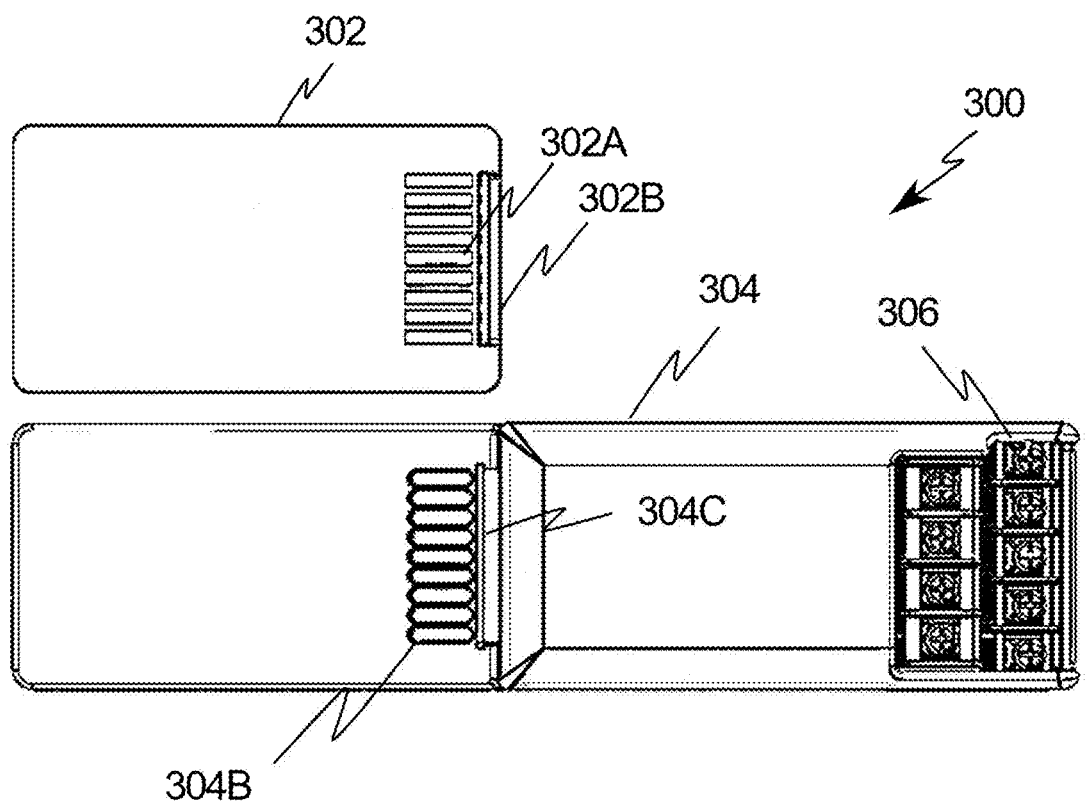
Figure 26:
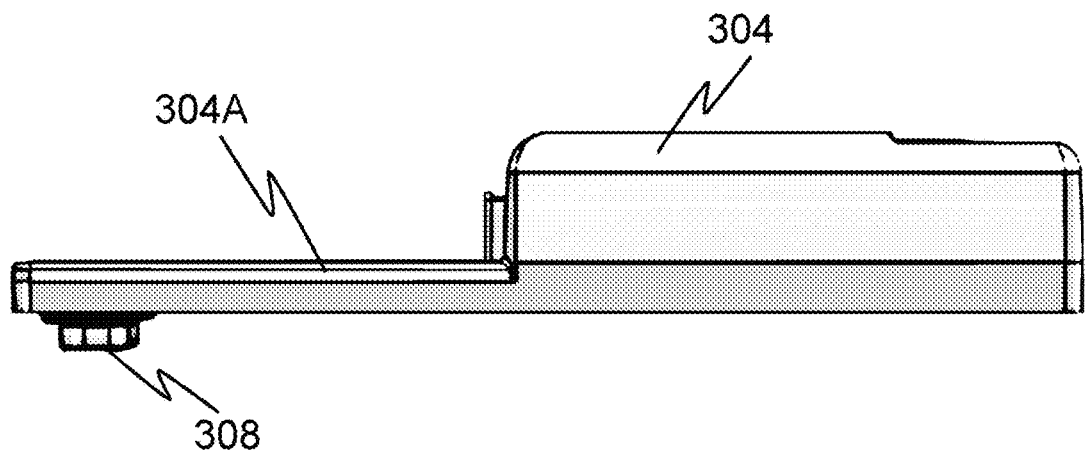
Figure 27:
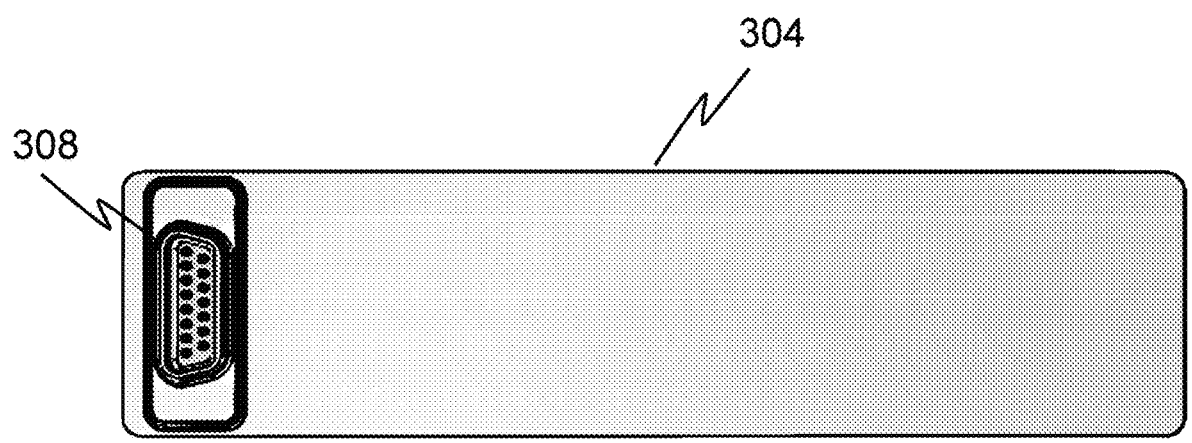
Figure 28:
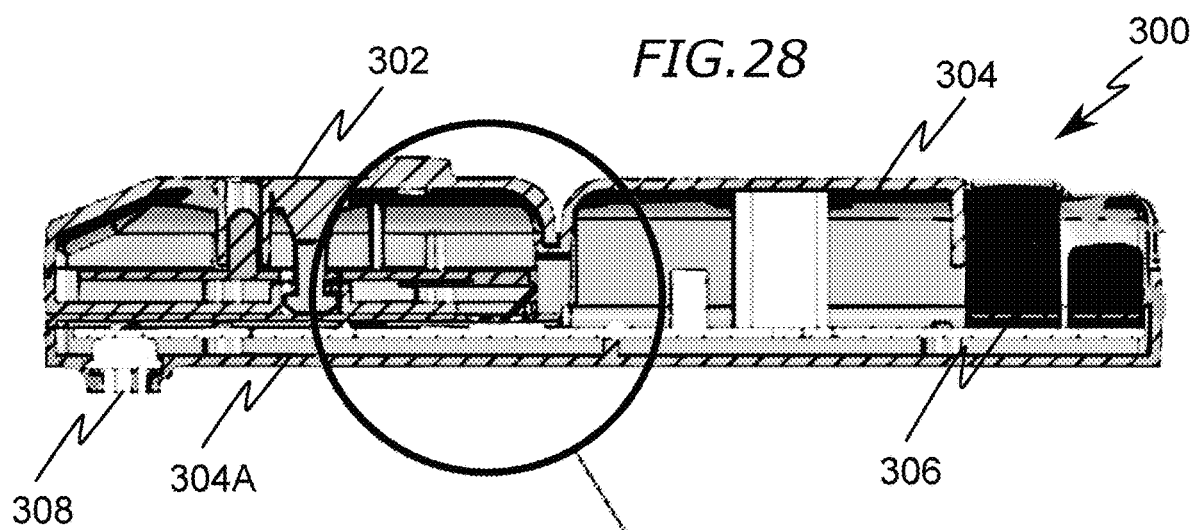
Figure 29:
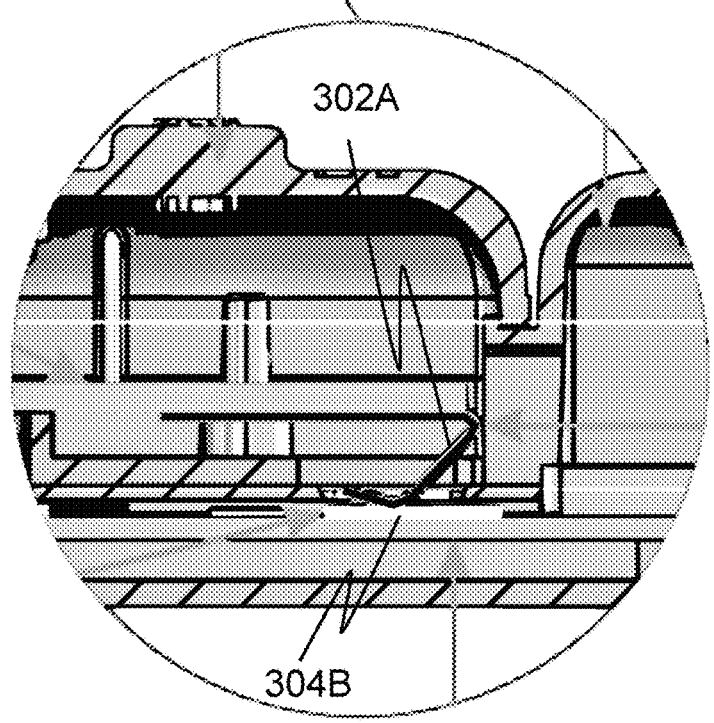
Figure 34:
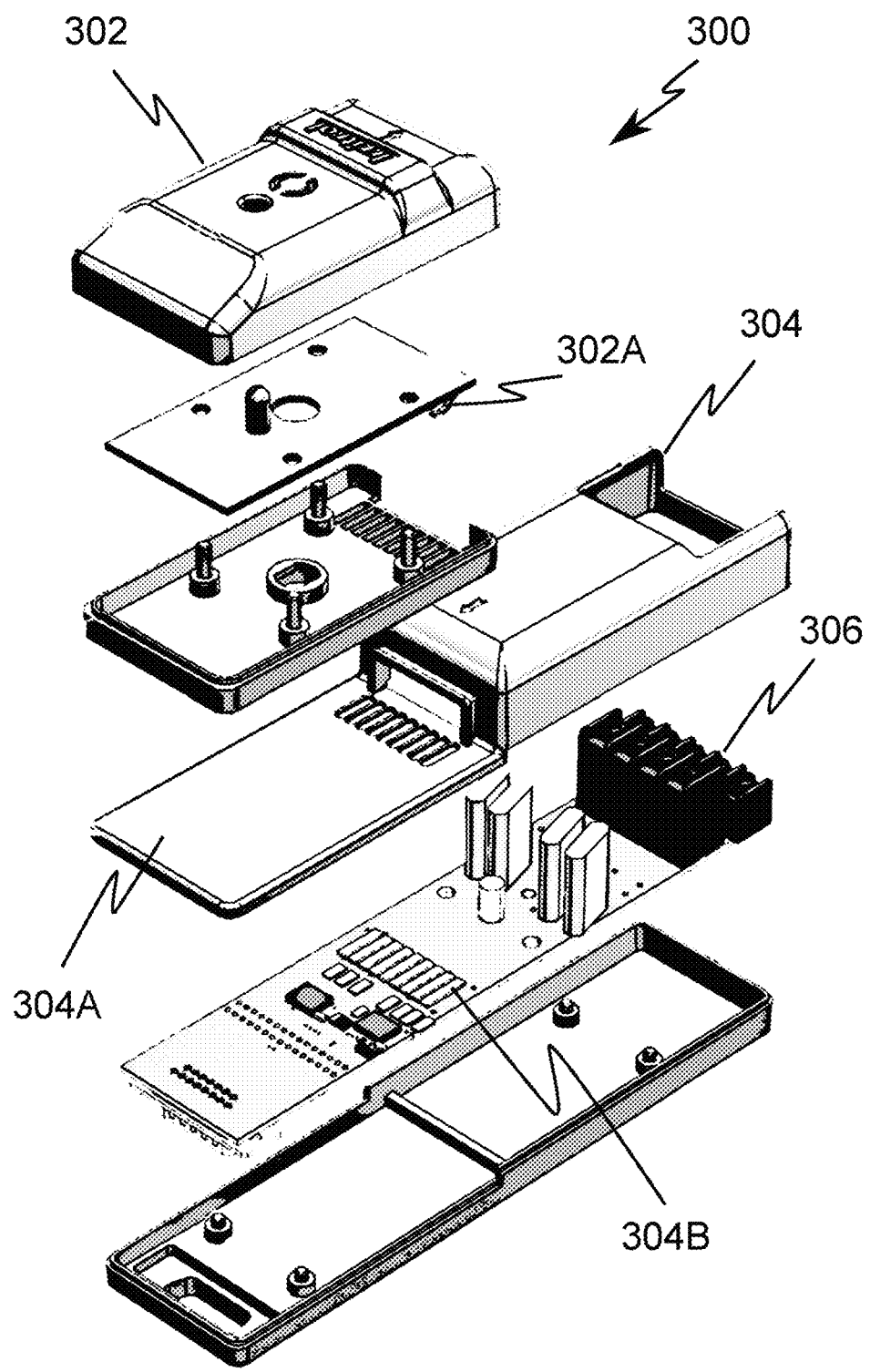

FIGS. 16 and 17 illustrate another embodiment of an irrigation controller 220 that allows the user interface module 222 to be flipped 180-degrees and is generally similar to the previously described embodiments. However, the irrigation controller 220 includes a hinge mechanism that allows the user interface module 222 to be removed and reconnected in an opposite orientation. Specifically, the rear housing 150 includes an upper mounting aperture 224A located at the upper left, and a lower mounting aperture 224B located at the lower left. These apertures 224A and 224B are sized and shaped to allow posts 226A-226D to extend into them.

In a first configuration, the user interface 222 is positioned so that its controls are facing outward from the interior of the rear housing 150. In such a position, upper left post 226A is positioned in the upper aperture 224A and the lower left post 226C is positioned in the lower aperture 224B. This arrangement allows the user interface module 222 to swing outward similar to a door hinge. One of the apertures 224A or 224B also preferably has a shape that allows the posts 226A and 226C to be easily removed. For example, the surface surrounding the lower aperture 224B may have a groove or similar feature that facilitates the removal of the post 226C.

Once the user interface module 222 is removed, the upper right post 226B can be placed in upper aperture 224A and the lower right post 226D can be placed in the lower aperture 224B. This configuration orients the face of the user interface module 222 (i.e., with the controls) at about 180-degrees relative to the first configuration described above. Hence, the user can simultaneously view the face of the user interface module 222 and the components of the interior of the rear housing 150.

It should be understood that a variety of different connection mechanisms can be used to achieve the connection mechanism of user interface module 222. For example, the apertures may instead be "C" shaped grooves that snap around the posts 226A-226D. In another example, the apertures and posts may be replaced by powerful magnets that allow the user interface module 222 to be magnetically connected and pulled off of the rear housing 150.

Another aspect of the present invention is directed to a movable mounting bracket 140 that facilitates easier mounting of the irrigation controller, as seen best in FIGS. 1 and 18-20. Specifically, the retracting mounting bracket 140 allows the user to mount the movable mounting bracket 140 at a first location and then move the irrigation controller 100 upwards to partially or completely cover the mounting bracket 140. In that respect, mounting the irrigation controller 100 is easier attached to a wall and can hide some of or all of the mounting bracket 140.

In one example, the mounting bracket 140 has an elongated horizontal portion with a lower handle area and one or more apertures sized for allowing a screw to pass through for mounting purposes. The mounting bracket 140 also includes two elongated vertical portions that are sized and shaped to fit within a track 143 on the back of the rear housing 150. These two tracks 143 allow the vertical portions of the mounting bracket 140 to be retained and slide vertically within the tracks 143.

Optionally, the mounting bracket 140 and track 143 includes locking feature that locks the mounting bracket 140 in a vertical position. For example, the vertical portion of the mounting bracket 140 may include an arm 145 that can engage with a mating groove 147 such that when the two are engaged, the mounting bracket 140 cannot be pulled out of the tracks 143. Alternately, the tracks 147 and vertical portions of the mounting bracket 140 may have tabs, detents, or other engaging features that allow for temporary engagement at various locations.

In operation, the user first places one or more screws through the apertures 142 in the horizontal portion of the mounting bracket 140 and into a wall. Next, the rear housing 150 of the irrigation controller 100 can be moved upward until a desired position is reached, such as covering the bracket 140. Finally, the user places a screw through screw aperture 149 in the back surface of the rear panel 150 and into the wall.

FIGS. 21-34 illustrate various views of an irrigation module 300 similar to the previously described irrigation module 170 that can be separated by a user into two components. For example, the irrigation module 300 includes a base portion 304 which includes irrigation wire terminals 306 and a main portion 302 that contains a processor (and optionally other components) that physically and electrically connect to the base module 304, allowing only a portion of the irrigation module 300 to be replaced, as necessary.

Many irrigation controllers are configured to allow a plurality of irrigation modules to be connected within their housing. Typically, irrigation modules each include a plurality of wire terminals that allow one or more irrigation stations (e.g., valves) to be connected and/or may include other added functionality, such as sensor input or a communication transceiver. Primarily, this modular design allows manufacturers to sell the irrigation controller for a relatively low amount while allowing the users to upgrade the number of irrigation terminals or other functions as needed.

In some circumstances, these irrigation modules can become damaged. For example, lightning strikes or other electrical surges can damage sensitive electrical components within the modules, such as a processor, microcontroller, sensors, communication transceivers, or similar components. In such cases, the entire module typically must be replaced, which may involve removing all of the irrigation station wires or sensor wires from the module's irrigation terminal and reattaching them to the new replacement module. This replacement process may require a significant amount of time to properly re-attached the desired wires to the new module and can result in m is-wiring. The present irrigation assembly helps circumvent the time and effort needed to rewire a new module by allowing only the main portion 302 of the module 300 containing the processor, sensor circuitry, communications circuitry, or other electrical components to be replaced while leaving prior, already wired base portion 304 in place without change.

In one example, the separating irrigation module 300 includes a base portion 304 including a plurality of irrigation terminals 306 located at one end and being configured to connect to electrical wires. At the opposite end, the base portion 304 includes an attachment area 304A configured to physical and electrically attach to the main portion 302. For example, the attachment area 304A may include a horizontal platform with a plurality of base electrical contacts 304B that are positioned to align with main electrical contacts 302A to establish electrical communication between the portions 302, 304. Additionally, the attachment area 304A includes a key member 304C that is positioned to extend into and mate with groove 302B on the main portion 302 (best seen in FIGS. 24, 25, and 30. Hence, the main portion 302 remains both physical and electrically connected to the base portion 304.

The irrigation module 300 may be connected to a module slot or position within the irrigation controller 100. For example, communication port 308 on the bottom of the base portion 304 may connect to a similar mating connection port located at one of the irrigation module positions.

In operation, a user initially installs the irrigation module 300 by placing it within an irrigation controller 100 and connecting the irrigation module 300 via the communication port 308. Irrigation station wires are then connected to the wire terminals 306. When electrical components become damaged, the main portion 302 is removed from the base portion 304 and a new main portion 302 is replaced on the original base portion 304, eliminating the need to remove and rewire the irrigation wires.

It should be understood that different design aspects of a particularly designed embodiment can be combined with any other embodiment described herein. For example, the embodiment of FIG. 1 in which a communication cable passes through a post on the user interface module may be incorporated into other rotating interface embodiments.

Although the invention has been described in terms of particular embodiments and applications, one of ordinary skill in the art, in light of this teaching, can generate additional embodiments and modifications without departing from the spirit of or exceeding the scope of the claimed invention. Accordingly, it is to be understood that the drawings and descriptions herein are proffered by way of example to facilitate comprehension of the invention and should not be construed to limit the scope thereof.

What is claimed is:

1. An irrigation controller, comprising:
   a controller housing;
   a user interface module having a plurality of user input structures on a first side of the user interface module; and,
   a supporting frame connected via a hinge to the controller housing and a pivotal connection to the user interface module; wherein the user interface module pivots between a first position and a second position 180 degrees from the first position relative to the supporting frame while remaining connected to the supporting frame.

2. The irrigation controller of claim 1, wherein the supporting frame having an opening and the user interface module is pivotally connected within the opening.

3. The irrigation controller of claim 1, wherein the hinge assembly comprises a first arm pivotally mounted to a top of the user interface module.

4. The irrigation controller of claim 3, wherein the hinge assembly comprises a second arm pivotally mounted to a bottom of the user interface module.

5. The irrigation controller of claim 1, wherein the hinge assembly further comprises an elongated member connected to the housing via a first hinge and pivotally connected to a top or bottom of the user interface module.

6. The irrigation controller of claim 1, wherein the user interface module includes a post on a top of the user interface module and a communication wire connected within the controller housing, extending through the post, and electrically connecting to the user interface module.

7. An irrigation controller, comprising:
   a controller housing;
   a user interface module having a plurality of user input structures on a first side of the user interface module; and,
   a frame structure connected via a hinge to the controller housing and a rotatable connection to the user interface module;
   wherein the user interface module is rotatable relative to the frame structure between a first position in which the first side of the user interface faces a first direction and a second position in which the first side of the user interface faces a second direction that is generally opposite to the first direction while remaining connected to the frame structure.

8. The irrigation controller of claim 7, wherein the frame structure connected via the hinge to the controller housing such that the frame structure moves relative to the controller housing.

9. The irrigation controller of claim 8, wherein the user interface module comprises a top and bottom post.

10. The irrigation controller of claim 8, wherein the user interface module comprises a stop mechanism limiting rotation of the user interface module beyond a predetermined rotational position.

11. The irrigation controller of claim 8, further comprising a sensor configured to sense a rotational position of the user interface module.

12. The irrigation controller of claim 11, wherein the irrigation controller is configured to change an electronically displayed menu of the user interface module based on the sensed rotational position of the user interface module.

13. The irrigation controller of claim 11, wherein the irrigation controller is configured to activate or deactivate a light within the controller housing based on the sensed rotational position of the user interface module.

14. The irrigation controller of claim 7, further comprising a communication cable connected to the user interface module, extending through the frame structure, and further extending into the controller housing.

15. The irrigation controller of claim 7, wherein the user interface module configured for wireless communication with components within the controller housing.

16. An irrigation controller, comprising:
a controller housing;
a user interface module having a plurality of input structures on a first side of the user interface module; and
a frame member connected via a hinge to the controller housing and a rotatable connection to the user interface module; wherein the user interface module rotates near a middle of the user interface module relative to the frame member so that the first side rotates 180 degrees while remaining connected to the frame member.

17. The irrigation controller of claim 16, wherein the frame member connected via the hinge to the controller housing such that the frame member swings outward relative to the controller housing.

18. The irrigation controller of claim 17, wherein the the user interface module comprises at least a first post positioned near a middle of the user interface module.

19. The irrigation controller of claim 17, further comprising a stop mechanism limiting rotation of the user interface module beyond a predetermined rotational position.

* * * * *